(12) United States Patent
Baba et al.

(10) Patent No.: US 10,305,157 B2
(45) Date of Patent: May 28, 2019

(54) HIGH-FREQUENCY SIGNAL TRANSMISSION LINE AND ELECTRONIC DEVICE

(71) Applicant: Murata Manufacturing Co., Ltd., Nagaokakyo-shi, Kyoto-fu (JP)

(72) Inventors: Takahiro Baba, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/028,462

(22) Filed: Jul. 6, 2018

(65) Prior Publication Data

US 2018/0316080 A1 Nov. 1, 2018

Related U.S. Application Data

(60) Division of application No. 15/017,812, filed on Feb. 8, 2016, now Pat. No. 10,044,086, which is a continuation of application No. PCT/JP2014/084523, filed on Dec. 26, 2014.

(30) Foreign Application Priority Data

Feb. 4, 2014 (JP) .................................. 2014-019079

(51) Int. Cl.
*H01P 3/08* (2006.01)
*H01P 3/06* (2006.01)
*H05K 1/02* (2006.01)
*H05K 1/14* (2006.01)

(52) U.S. Cl.
CPC ................ *H01P 3/082* (2013.01); *H01P 3/06* (2013.01); *H01P 3/085* (2013.01); *H05K 1/025* (2013.01); *H05K 1/0225* (2013.01); *H05K 1/0253* (2013.01); *H05K 1/147* (2013.01); *H05K 2201/09272* (2013.01); *H05K 2201/09281* (2013.01); *H05K 2201/09727* (2013.01); *H05K 2201/10189* (2013.01)

(58) Field of Classification Search
CPC ............. H01P 3/08; H01P 3/082; H01P 3/085
USPC ..................... 333/238, 246, 33, 34
See application file for complete search history.

(56) References Cited

PUBLICATIONS

Baba et al., "High-Frequency Signal Transmission Line and Electronic Device", U.S. Appl. No. 15/017,812, filed Feb. 8, 2016.

*Primary Examiner* — Stephen E. Jones
(74) *Attorney, Agent, or Firm* — Keating & Bennett, LLP

(57) ABSTRACT

A high-frequency signal transmission line includes an element, a linear signal line provided at the element and including a first end and a second end, and at least one ground conductor provided at the element and extending along the signal line. The element includes stacked insulating layers. The ground conductor is positioned opposite to the signal line with the insulating layer positioned therebetween. The ground conductor is a contiguous conductor. The signal line, the ground conductor, and the element generate a characteristic impedance. The signal line includes a first section and a second section. The first section is an uninterrupted section generating a characteristic impedance greater than or equal to a first characteristic impedance at the first end and including the first end. The second section generates a characteristic impedance less than the first characteristic impedance and is adjacent to the first section. The second section is longer than the first section. The signal line is wider in the second section than in the first section.

4 Claims, 15 Drawing Sheets

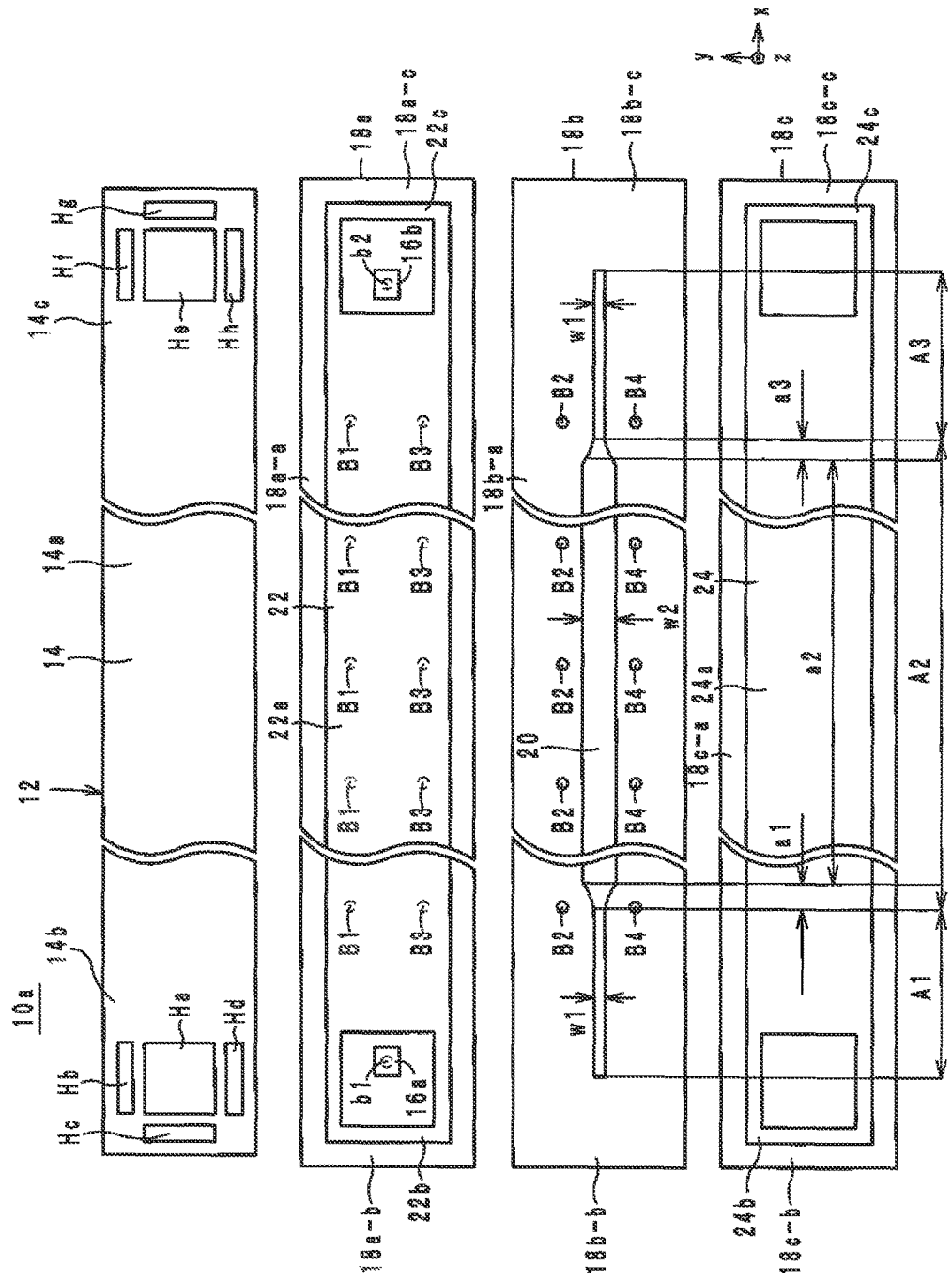

HIGH-FREQUENCY SIGNAL TRANSMISSION LINE AND ELECTRONIC DEVICE

This application is based on International Application No. PCT/JP2014/084523 filed on Dec. 26, 2014, and Japanese Patent Application No. 2014-19079 filed on Feb. 4, 2014, the entire content of each of which is incorporated herein by reference.

BACKGROUND OF THE INVENTION

1. Field of the Invention

The present invention relates to high-frequency signal transmission lines and electronic devices, more particularly to a high-frequency signal transmission line including a signal line and ground conductors, and an electronic device including the same.

2. Description of the Related Art

As a conventional high-frequency signal transmission line, a high-frequency signal line described in, for example, International Publication No. 2012/074101 is known. This high-frequency signal line includes a dielectric element, a signal line, a first ground conductor, and a second ground conductor. The signal line, the first ground conductor, and the second ground conductor are provided at the dielectric element. Moreover, the signal line is vertically sandwiched between the first ground conductor and the second ground conductor. That is, the signal line, the first ground conductor, and the second ground conductor form a stripline structure. Further, the second ground conductor includes a plurality of openings overlapping the signal line. Such a high-frequency signal line having the openings provided in the second ground conductor renders it possible to reduce capacitance generated between the second ground conductor and the signal line, so that the dielectric element can be rendered thinner by providing the second ground conductor and the signal line closer to each other.

There has been demand to further reduce insertion loss in the high-frequency signal line described in International Publication No. 2012/074101.

SUMMARY OF THE INVENTION

A first aspect of various preferred embodiments of the present invention is directed to a high-frequency signal transmission line including an element, a linear signal line provided at the element and including a first end and a second end, and at least one ground conductor provided at the element and extending along the signal line. The element includes stacked insulating layers. The ground conductor is positioned opposite to the signal line with the insulating layer positioned therebetween. The ground conductor is a contiguous conductor. The signal line, the ground conductor, and the element generate a characteristic impedance. The signal line includes a first section and a second section. The first section is an uninterrupted section generating a characteristic impedance greater than or equal to a first characteristic impedance at the first end and including the first end. The second section generates a characteristic impedance less than the first characteristic impedance and is adjacent to the first section. The second section is longer than the first section. The signal line is wider in the second section than in the first section.

A second aspect of various preferred embodiments of the present invention is directed to a high-frequency signal transmission line including an element, a linear signal line provided at the element and including a first end and a second end, and at least one ground conductor provided at the element and extending along the signal line. The element includes stacked insulating layers. The ground conductor is positioned opposite to the signal line with the insulating layer positioned therebetween. The ground conductor includes a plurality of openings arranged along the signal line. The signal line, the ground conductor, and the element generate a characteristic impedance. The signal line includes a first section and a second section. The first section is an uninterrupted section generating a characteristic impedance greater than or equal to a first characteristic impedance at the first end and including the first end. The second section generates a characteristic impedance less than the first characteristic impedance and is adjacent to the first section. The second section is longer than the first section. The openings are arranged in descending order of overlapping area with the signal line in the second section toward a farthest end from the first section.

A third aspect of various preferred embodiments of the present invention is directed to an electronic device including a high-frequency signal transmission line, and a housing accommodating the high-frequency signal transmission line. The high-frequency signal transmission line includes an element, a linear signal line provided at the element and including a first end and a second end, and at least one ground conductor provided at the element and extending along the signal line. The element includes stacked insulating layers. The ground conductor is positioned opposite to the signal line with the insulating layer positioned therebetween. The ground conductor is a contiguous conductor. The signal line, the ground conductor, and the element generate a characteristic impedance. The signal line includes a first section and a second section. The first section is an uninterrupted section generating a characteristic impedance greater than or equal to a first characteristic impedance at the first end and including the first end. The second section generates a characteristic impedance less than the first characteristic impedance and is adjacent to the first section. The second section is longer than the first section. The signal line is wider in the second section than in the first section.

A fourth aspect of various preferred embodiments of the present invention is directed to an electronic device including a high-frequency signal transmission line, and a housing accommodating the high-frequency signal transmission line. The high-frequency signal transmission line includes an element, a linear signal line provided at the element and including a first end and a second end, and at least one ground conductor provided at the element and extending along the signal line. The element includes stacked insulating layers. The ground conductor is positioned opposite to the signal line with the insulating layer positioned therebetween. The ground conductor includes a plurality of openings arranged along the signal line. The signal line, the ground conductor, and the element generate a characteristic impedance. The signal line includes a first section and a second section. The first section is an uninterrupted section generating a characteristic impedance greater than or equal to a first characteristic impedance at the first end and including the first end. The second section generates a characteristic impedance less than the first characteristic impedance and is adjacent to the first section. The second section is longer than the first section. The openings are arranged in descending order of overlapping area with the signal line in the second section toward a farthest end from the first section.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7A is an exploded view of a dielectric element 12 of a high-frequency signal transmission line 10a.

DETAILED DESCRIPTION OF THE PREFERRED EMBODIMENTS

Hereinafter, high-frequency signal transmission line according to preferred embodiments of the present invention, along with an electronic device using the same, will be described with reference to the drawings.

Figure 1:
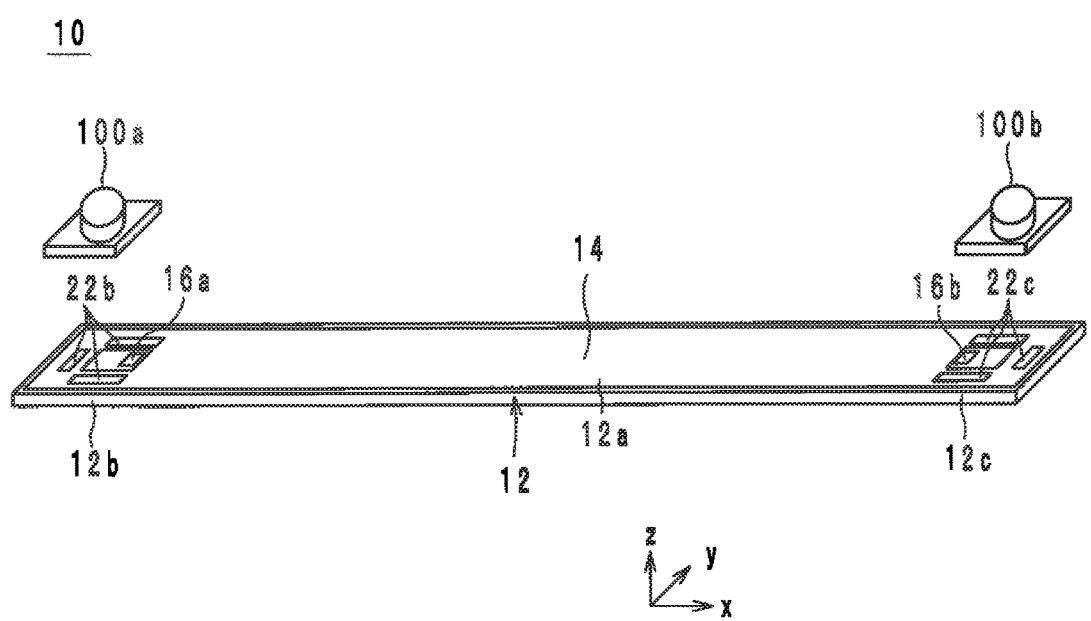
FIG. 1 is an external oblique view of a high-frequency signal transmission line 10 according to a preferred embodiment of the present invention.
Figure 2:
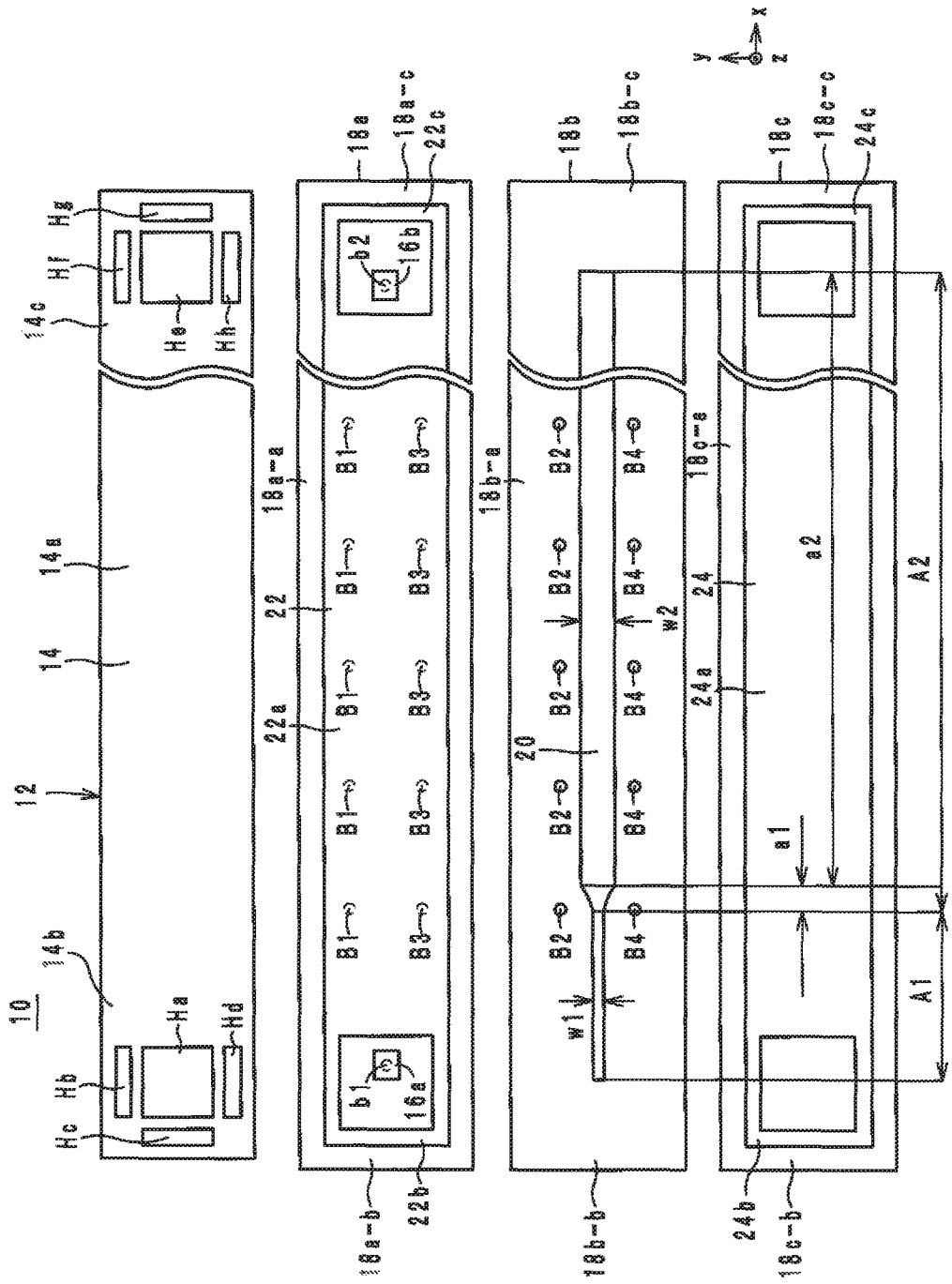
FIG. 2 is an exploded view of a dielectric element 12 of the high-frequency signal transmission line 10 in FIG. 1.
Figure 3:
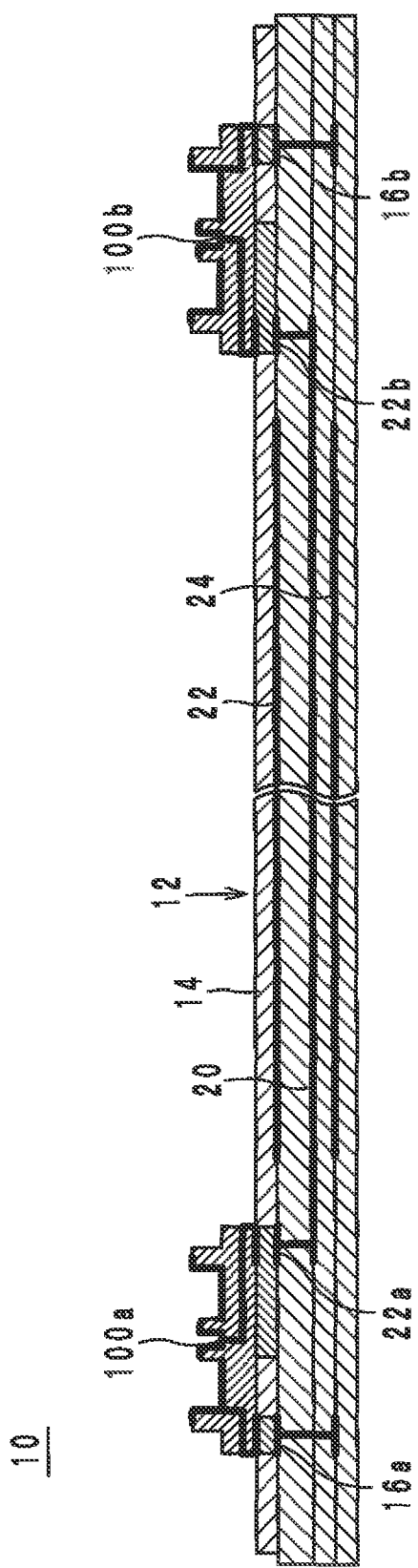
FIG. 3 is a cross-sectional structure view of the high-frequency signal transmission line 10 in FIG. 1.
Figure 4:
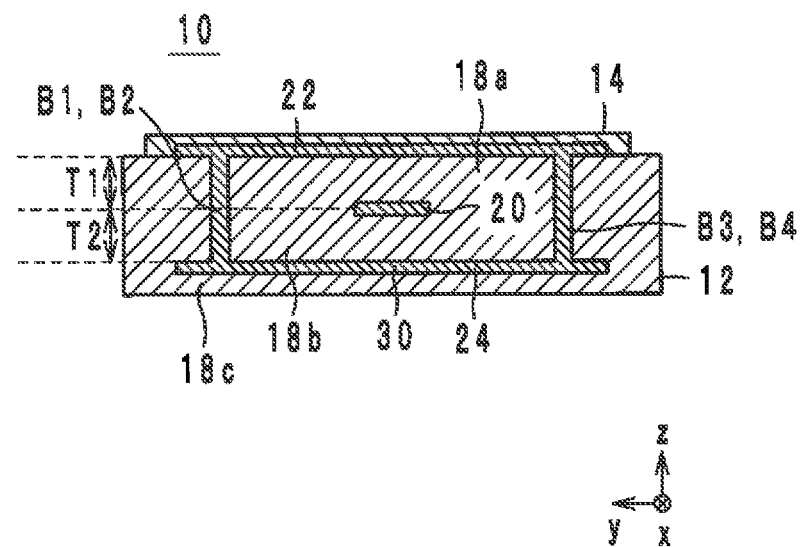
FIG. 4 is another cross-sectional structure view of the high-frequency signal transmission line 10.
Figure 5A:
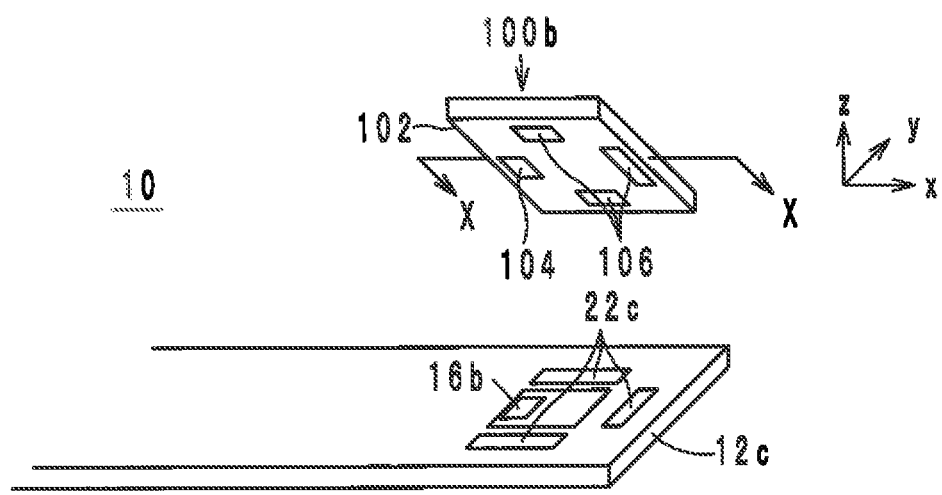
FIG. 5A is an oblique view illustrating a connector 100b and a connecting portion 12c.
Figure 5B:
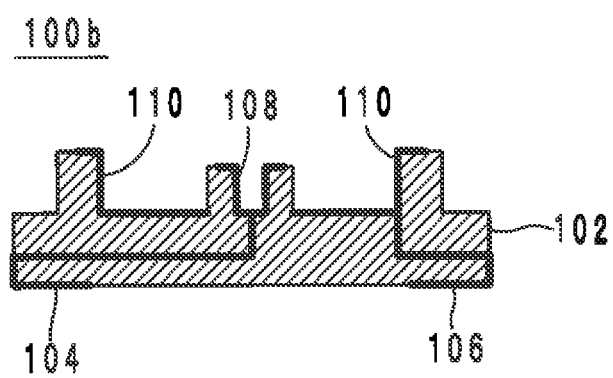
FIG. 5B is a cross-sectional view of the connector 100b.
Figure 5C:
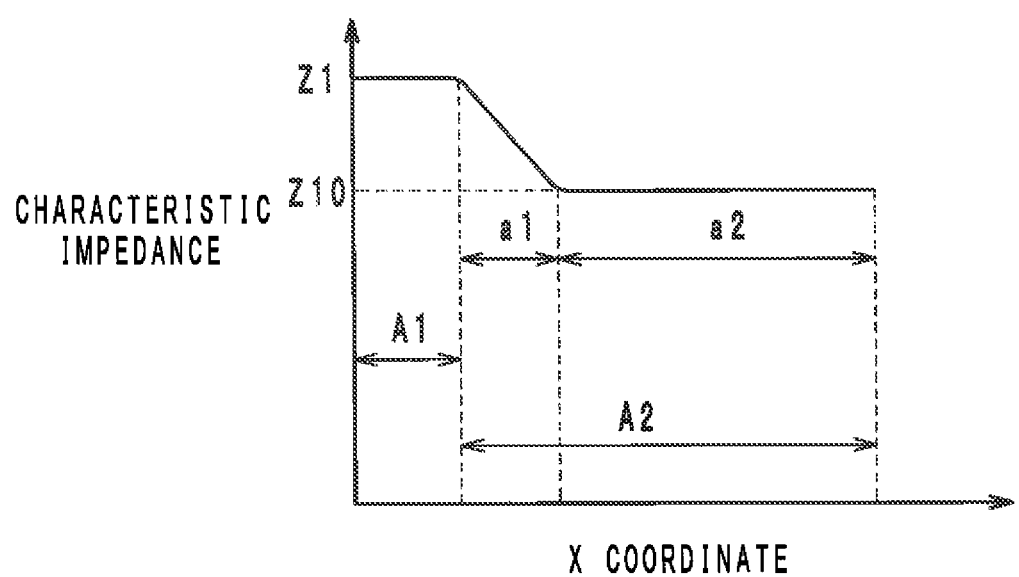
FIG. 5C is a graph showing the characteristic impedance of the high-frequency signal transmission line 10.

The configuration of the high-frequency signal transmission line 10 according to the present preferred embodiment will be described below. FIG. 1 is an external oblique view of the high-frequency signal transmission line 10 according to the present preferred embodiment. FIG. 2 is an exploded view of a dielectric element 12 of the high-frequency signal transmission line 10 in FIG. 1. FIG. 3 is a cross-sectional structure view of the high-frequency signal transmission line 10 in FIG. 1. FIG. 4 is another cross-sectional structure view of the high-frequency signal transmission line 10. FIG. 5A is an oblique view illustrating a connector 100b and a connecting portion 12c. FIG. 5B is a cross-sectional view of the connector 100b. FIG. 5C is a graph showing the characteristic impedance of the high-frequency signal transmission line 10. In FIG. 5C, the vertical axis represents the characteristic impedance, and the horizontal axis represents the x-coordinate. In FIGS. 1 through 4, the stacking direction of the high-frequency signal transmission line 10 is defined as the z-axis direction. In addition, the longitudinal direction of the high-frequency signal transmission line 10 is defined as an x-axis direction, and the direction perpendicular to the x-axis and z-axis directions are defined as the y-axis direction.

Furthermore, the length refers below to the dimension of the signal line 20 and other components in the x-axis direction. Also, the width refers below to the dimension of the signal line 20 and other components in the y-axis direction. In addition, the thickness refers below to the dimension of the dielectric sheet 18 and other components in the z-axis direction.

The high-frequency signal transmission line 10 preferably is used to, for example, connect two high-frequency circuits in an electronic device such as a cellphone. The high-frequency signal transmission line 10 includes the dielectric element 12, external terminals 16a and 16b, a signal line 20, ground conductors 22 and 24, via-hole conductors b1, b2, B1, B2, B3, and B4, a connector 100a, and the connector 100b, as shown in FIGS. 1 through 3.

The dielectric element 12 is in the form of a strip extending in the x-axis direction when viewed in a plan view in the z-axis direction, and includes a line portion 12a, a connecting portion 12b, and the connecting portion 12c. The dielectric element 12 is a stack formed by stacking a protective layer 14 and dielectric sheets 18a, 18b, and 18c, in this order from the positive side to the negative side in the z-axis direction, as shown in FIG. 2. In the following, principal surfaces of the dielectric element 12 and the dielectric sheets 18a to 18c that are located on the positive side in the z-axis direction will be referred to as top surfaces, and principal surfaces of the dielectric element 12 and the dielectric sheets 18a to 18c that are located on the negative side in the z-axis direction will be referred to as bottom surfaces.

The line portion 12a extends in the x-axis direction. The connecting portion 12b is connected to the end of the line portion 12a on the negative side in the x-axis direction. The connecting portion 12c is connected to the end of the line portion 12a on the positive side in the x-axis direction. The connecting portions 12b and 12c are areas on which the connectors 100a and 100b to be described later are respectively mounted. The width of each of the connecting portions 12b and 12c is equal to the width of the line portion 12a.

The dielectric sheets 18a to 18c, when viewed in a plan view in the z-axis direction, extend in the x-axis direction and have the same strip-shaped structure as the dielectric element 12. The dielectric sheets 18a to 18c are made of a flexible thermoplastic resin such as polyimide or liquid crystal polymer. The dielectric sheet 18a has a thickness T1 equal or substantially equal to a thickness T2 of the dielectric sheet 18b, as shown in FIG. 4. After the stacking of the dielectric sheets 18a to 18c, the thicknesses T1 and T2 preferably are, for example, within the range of from about 50 μm to about 300 μm. In the present preferred embodiment, both the thicknesses T1 and T2 preferably are about 150 μm.

Furthermore, the dielectric sheet 18a includes a line portion 18a-a and connecting portions 18a-b and 18a-c. The dielectric sheet 18b includes a line portion 18b-a and connecting portions 18b-b and 18b-c. The dielectric sheet 18c includes a line portion 18c-a and connecting portions 18c-b and 18c-c. The line portions 18a-a, 18b-a, and 18c-a constitute the line portion 12a. The connecting portions 18a-b, 18b-b, and 18c-b constitute the connecting portion 12b. The connecting portions 18a-c, 18b-c, and 18c-c constitute the connecting portion 12c.

The external terminal 16a is a rectangular or substantially rectangular conductor provided near the center on the top surface of the connecting portion 18a-b, as shown in FIGS. 1 and 2. The external terminal 16b is a rectangular or substantially rectangular conductor provided near the center on the top surface of the connecting portion 18a-c, as shown in FIGS. 1 and 2. The external terminals 16a and 16b are made of a metal material mainly composed of silver or copper and having a low specific resistance. In addition, the top surfaces of the external terminals 16a and 16b are plated with gold, for example.

The signal line 20 is a linear conductor provided in the dielectric element 12 and extending on the top surface of the dielectric sheet 18b in the x-axis direction, as shown in FIG. 2. Accordingly, the signal line 20 has an end located on the negative side in the x-axis direction (first end) and an end located on the positive side in the x-axis direction (second end). The ends of the signal line 20 in the x-axis direction respectively overlap the external terminals 16a and 16b when viewed in a plan view in the z-axis direction. The signal line 20 is made of a metal material mainly composed of silver or copper and having a low specific resistance. The signal line 20 having such a structure transmits a high-frequency signal. The width of the signal line 20 will be described later.

The ground conductor 22 is provided in the dielectric element 12, more precisely, on the top surface of the dielectric sheet 18a, so as to be located on the positive side in the z-axis direction relative to the signal line 20, as shown in FIG. 2. The ground conductor 22 extends in the x-axis direction on the top surface of the dielectric sheet 18a, and is opposite to the signal line 20 with the dielectric sheet 18a positioned therebetween. The ground conductor 22 is made of a metal material mainly composed of silver or copper and having a low specific resistance.

Furthermore, the ground conductor 22 includes a line portion 22a and terminal portions 22b and 22c. The line portion 22a is provided on the top surface of the line portion 18a-a and extends in the x-axis direction. The line portion 22a has essentially no openings provided therein. That is, the line portion 22a is a so-called contiguous conductor extending uninterruptedly in the x-axis direction along the signal line 20. However, the line portion 22a may have some minute holes that unintentionally occurred during the production of the high-frequency signal transmission line 10. The terminal portion 22b preferably is a rectangular or substantially rectangular frame surrounding the external terminal 16a on the top surface of the connecting portion 18a-b. The terminal portion 22b is connected to the end of the line portion 22a on the negative side in the x-axis direction. The terminal portion 22c preferably is a rectangular or substantially rectangular frame surrounding the external terminal 16b on the top surface of the connecting portion 18a-c. The terminal portion 22c is connected to the end of the line portion 22a on the positive side in the x-axis direction. The ground conductor 22 having such a structure is subjected to application of a ground potential.

The ground conductor 24 is provided in the dielectric element 12, more precisely, on the top surface of the dielectric sheet 18c, so as to be located on the negative side in the z-axis direction relative to the signal line 20, as shown in FIG. 2. The ground conductor 24 extends in the x-axis direction on the top surface of the dielectric sheet 18c, and is opposite to the signal line 20 with the dielectric sheet 18b positioned therebetween. That is, the ground conductor 24 is opposite to the ground conductor 22 with the signal line 20 positioned therebetween. The ground conductor 24 is made of a metal material mainly composed of silver or copper and having a low specific resistance.

Furthermore, the ground conductor 24 includes a line portion 24a and terminal portions 24b and 24c. The line portion 24a is provided on the top surface of the line portion 18c-a and extends in the x-axis direction. The line portion 24a has essentially no openings provided therein. That is, the line portion 24a is a so-called contiguous conductor extending uninterruptedly in the x-axis direction along the signal line 20. However, the line portion 24a may have some minute holes that unintentionally occurred during the production of the high-frequency signal transmission line 10. The terminal portion 24b preferably is a rectangular or substantially rectangular frame on the top surface of the connecting portion 18c-b. The terminal portion 24b is connected to the end of the line portion 24a on the negative side in the x-axis direction. The terminal portion 24c preferably is a rectangular or substantially rectangular frame on the top surface of the connecting portion 18c-c. The terminal portion 24c is connected to the end of the line portion 24a on the positive side in the x-axis direction. The ground conductor 24 having such a structure is subjected to application of a ground potential.

In this manner, the signal line 20 is sandwiched between the ground conductors 22 and 24 with the dielectric sheets 18a and 18b intervening on the opposite sides in the z-axis direction. That is, the signal line 20 and the ground conductors 22 and 24 form a tri-plate stripline structure. Moreover, the distance between the signal line 20 and the ground conductor 22 preferably is equal or approximately equal to the thickness T1 of the dielectric sheet 18a, e.g., about 50 μm to about 300 μm, as shown in FIG. 4. In the present preferred embodiment, the distance between the signal line 20 and the ground conductor 22 preferably is about 150 μm, for example. Further, the distance between the signal line 20 and the ground conductor 24 preferably is approximately equal to the thickness T2 of the dielectric sheet 18b, e.g., about 50 μm to about 300 μm, as shown in FIG. 4. In the present preferred embodiment, the distance between the signal line 20 and the ground conductor 24 preferably is about 150 μm, for example.

The via-hole conductor b1 passes through the connecting portion 18a-b of the dielectric sheet 18a in the z-axis direction, so as to connect the external terminal 16a and the end of the signal line 20 on the negative side in the x-axis direction. The via-hole conductor b2 passes through the connecting portion 18a-c of the dielectric sheet 18a in the z-axis direction, so as to connect the external terminal 16b and the end of the signal line 20 on the positive side in the x-axis direction. Accordingly, the signal line 20 is connected between the external terminals 16a and 16b. The via-hole conductors b1 and b2 are made of a metal material mainly composed of silver or copper and having a low specific resistance.

The via-hole conductors B1 and B2 respectively pass through the line portion 18a-a of the dielectric sheet 18a and the line portion 18b-a of the dielectric sheet 18b in the z-axis direction, and when viewed in a plan view in the z-axis direction, the via-hole conductors B1 and B2 are located on the positive side in the y-axis direction relative to the signal line 20. The via-hole conductors B1 and B2 are provided in a plurality respectively in the line portions 18a-a and 18b-a, so as to be arranged in lines in the x-axis direction. Moreover, the via-hole conductors B1 and B2 are connected in pairs, each constituting a single via-hole conductor, thus connecting the ground conductor 22 and the ground conductor 24. The via-hole conductors B1 and B2 are made of a metal material mainly composed of silver or copper and having a low specific resistance.

The via-hole conductors B3 and B4 respectively pass through the line portion 18a-a of the dielectric sheet 18a and the line portion 18b-a of the dielectric sheet 18b in the z-axis direction, and when viewed in a plan view in the z-axis direction, the via-hole conductors B3 and B4 are located on the negative side in the y-axis direction relative to the signal line 20. The via-hole conductors B3 and B4 are provided in a plurality respectively in the line portions 18a-a and 18b-a, so as to be arranged in lines in the x-axis direction. Moreover, the via-hole conductors B3 and B4 are connected in pairs, each constituting a single via-hole conductor, thus connecting the ground conductor 22 and the ground conductor 24. The via-hole conductors B3 and B4 are made of a metal material mainly composed of silver or copper and having a low specific resistance.

The protective layer 14 covers approximately the entire top surface of the dielectric sheet 18a. Accordingly, the ground conductor 22 is covered by the protective layer 14. The protective layer 14 is made of, for example, a flexible resin such as a resist material.

Furthermore, the protective layer 14 includes a line portion 14a and connecting portions 14b and 14c, as shown in FIG. 2. The line portion 14a covers approximately the entire top surface of the line portion 18a-a, including the line portion 22a.

The connecting portion 14b is connected to the end of the line portion 14a on the negative side in the x-axis direction, and covers the top surface of the connecting portion 18a-b. The connecting portion 14b has openings Ha, Hb, Hc, and Hd provided therein. The opening Ha is a rectangular or substantially rectangular opening provided at the center of the connecting portion 14b. The external terminal 16a is exposed to the outside from the opening Ha. The opening Hb is a rectangular or substantially rectangular opening provided on the positive side in the y-axis direction relative to the opening Ha. The opening Hc is a rectangular or substantially rectangular opening provided on the negative side in the y-axis direction relative to the opening Ha. The opening Hd is a rectangular or substantially rectangular opening provided on the negative side in the y-axis direction relative to the opening Ha. The terminal portion 22b is exposed to the outside from the openings Hb to Hd so as to define and function as an external terminal.

The connecting portion 14c is connected to the end of the line portion 14a on the positive side in the x-axis direction, and covers the top surface of the connecting portion 18a-c. The connecting portion 14c has openings He, Hf, Hg, and Hh provided therein. The opening He is a rectangular or substantially rectangular opening provided at the center of the connecting portion 14c. The external terminal 16b is exposed to the outside from the opening He. The opening Hf is a rectangular or substantially rectangular opening provided on the positive side in the y-axis direction relative to the opening He. The opening Hg is a rectangular or substantially rectangular opening provided on the positive side in the x-axis direction relative to the opening He. The opening Hh is a rectangular or substantially rectangular opening provided on the negative side in the y-axis direction relative to the opening He. The terminal portion 22c is exposed to the outside from the openings Hf to Hh so as to define and function as an external terminal.

The connectors 100a and 100b are mounted on the top surfaces of the connecting portions 12b and 12c, respectively. The connectors 100a and 100b have the same configuration, and therefore, only the configuration of the connector 100b will be described below as an example.

The connector 100b includes a connector body 102, external terminals 104 and 106, a center conductor 108, and an external conductor 110, as shown in FIGS. 1, 5A, and 5B. The connector body 102 includes a rectangular or substantially rectangular plate-shaped portion and a cylindrical portion protruding therefrom toward the positive side in the z-axis direction, and is made of an insulating material such as resin.

The external terminal 104 is positioned on the surface of the plate-shaped portion that is located on the negative side in the z-axis direction, so as to face the external terminal 16b. The external terminal 106 is positioned on the surface of the plate-shaped portion that is located on the negative side in the z-axis direction, so as to correspond to the terminal portion 22c exposed from the openings Hf to Hh.

The center conductor 108 is positioned at the center of the cylindrical portion of the connector body 102, and is connected to the external terminal 104. The center conductor 108 is a signal terminal to/from which a high-frequency signal is inputted/outputted. The external conductor 110 is positioned on the inner circumferential surface of the cylindrical portion of the connector body 102, and is connected to the external terminal 106. The external conductor 110 is a ground terminal to be kept at a ground potential.

The connector 100b having such a structure is mounted on the top surface of the connecting portion 12c, such that the external terminal 104 is connected to the external terminal 16b, and the external terminal 106 is connected to the terminal portion 22c. As a result, the signal conductor 20 is electrically connected to the center conductor 108. In addition, the ground conductors 22 and 24 are electrically connected to the external conductor 110.

Incidentally, to reduce insertion loss, the high-frequency signal transmission line 10 preferably has a structure will be described below. Specifically, the signal line 20 includes sections A1 and A2, as shown in FIG. 2. The section A1 is an uninterrupted section including the end of the signal line 20 on the negative side in the x-axis direction and generating a characteristic impedance greater than or equal to a characteristic impedance Z1 (e.g., about 50Ω) at the end of the signal line 20 on the negative side in the x-axis direction, as shown in FIG. 5C. More specifically, the section A1 extends toward the positive side in the x-axis direction starting from the end of the signal line 20 on the negative side in the x-axis direction. In the present preferred embodiment, the characteristic impedance generated in the section A1 is uniform at the characteristic impedance Z1.

The section A2 is adjacent to the section A1, and generates a characteristic impedance less than the characteristic impedance Z1, as shown in FIG. 5C. More specifically, the section A2 extends toward the positive side in the x-axis direction starting from the end of the section A1 on the positive side in the x-axis direction, and includes the end of the signal line 20 on the positive side in the x-axis direction. In addition, the section A2 is longer than the section A1.

Furthermore, the section A2 includes an impedance changing section a1 and an impedance unchanging section a2. The impedance changing section a1 is adjacent to the section A1, and extends toward the positive side in the x-axis direction starting from the end of the section A1 on the positive side in the x-axis direction. In the impedance changing section a1, the characteristic impedance decreases toward the farthest end from the section A1 (i.e., toward the end on the positive side in the x-axis direction), as shown in FIG. 5C. The impedance unchanging section a2 is adjacent to the impedance changing section a1, and extends toward the positive side in the x-axis direction starting from the end of the impedance changing section a1 on the positive side in the x-axis direction. The impedance unchanging section a2 generates a characteristic impedance Z10 (e.g., about 30Ω), which is essentially constant, as shown in FIG. 5C. The impedance unchanging section a2 includes the end of the signal line 20 on the positive side in the x-axis direction. Accordingly, the characteristic impedance at the end of the signal line 20 on the positive side in the x-axis direction is equal or substantially equal to the characteristic impedance Z10.

Furthermore, the length of the impedance changing section a1 is preferably greater than or equal to about ⅕ of the wavelength of the high-frequency signal to be transmitted through the signal line 20, more preferably greater than or equal to about ¼ of the wavelength of the high-frequency signal. In addition, the length of the impedance changing section a1 is preferably less than or equal to twice the wavelength of the high-frequency signal to be transmitted through the signal line 20.

In the high-frequency signal transmission line 10, the width of the signal line 20 varies between the sections with a view to generating the characteristic impedance. More specifically, in the section A1, the signal line 20 has a width w1 (e.g., about 100 μm). In the impedance unchanging section a2, the signal line 20 has a width w2 (e.g., about 300 μm) greater than the width w1. In this manner, in the section A1, the signal line 20 is relatively narrow, and therefore, the area of the signal line 20 that overlaps the ground conductors 22 and 24 per unit length is relatively small. Accordingly, in the section A1, the capacitance generated between the signal line 20 and the ground conductors 22 and 24 per unit length is relatively low, so that the characteristic impedance Z1 of the high-frequency signal transmission line becomes relatively high. On the other hand, in the impedance unchanging section a2, the signal line 20 is relatively wide, and therefore, the area of the signal line 20 that overlaps the ground conductors 22 and 24 per unit length is relatively large. Accordingly, in the impedance unchanging section a2, the capacitance generated between the signal line 20 and the ground conductors 22 and 24 per unit length is relatively high, so that the characteristic impedance Z1 of the high-frequency signal transmission line becomes relatively low.

Furthermore, the signal line 20 has the width w1 at the end of the impedance changing section a1 on the negative side in the x-axis direction, and also has the width w2 at the end of the impedance changing section a1 on the positive side in the x-axis direction. That is, in the impedance changing section a1, the width of the signal line 20 increases from the negative side in the x-axis direction toward the positive side (i.e., toward the farthest end from the section A1). In addition, in the impedance changing section a1, the width of the signal line 20 changes continuously. The wording "the width of the signal line 20 changes continuously" herein is intended to mean that the width does not change in a discontinuous, stepped manner. As a result, the characteristic impedance generated in the impedance changing section a1 continuously decreases from the characteristic impedance Z1 to the characteristic impedance Z10 from the negative side in the x-axis direction toward the positive side.

In this manner, the characteristic impedance of the high-frequency signal transmission line 10 is generated by the signal line 20, the ground conductors 22 and 24, and the dielectric element 12. Accordingly, the high-frequency signal transmission line 10 does not use a circuit, such as a balun, which does not include the signal line 20, the ground conductors 22 and 24, and the dielectric element 12, for the purpose of changing the characteristic impedance generated in the impedance changing section a1.

Figure 6A:
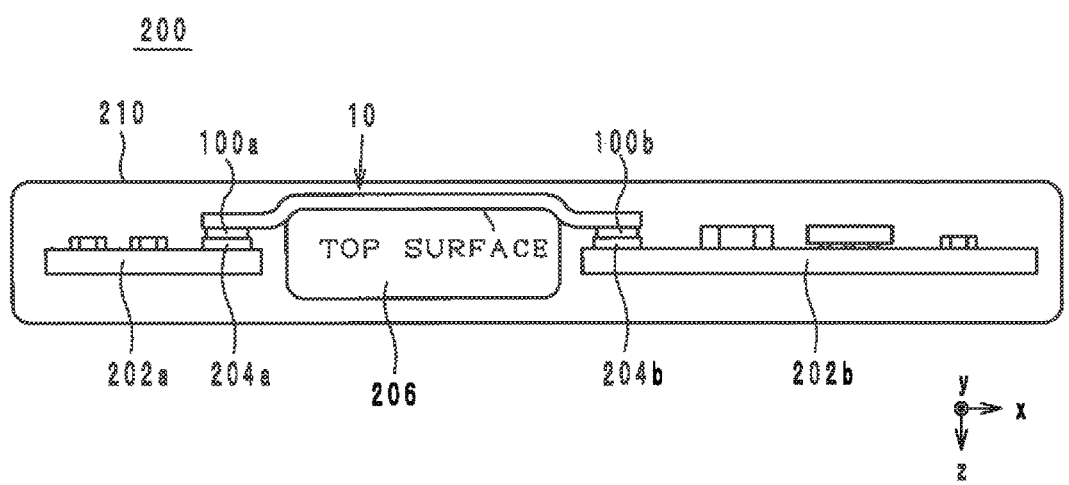
FIG. 6A illustrates an electronic device 200 provided with the high-frequency signal transmission line 10 as viewed in a plan view in the y-axis direction.
Figure 6B:
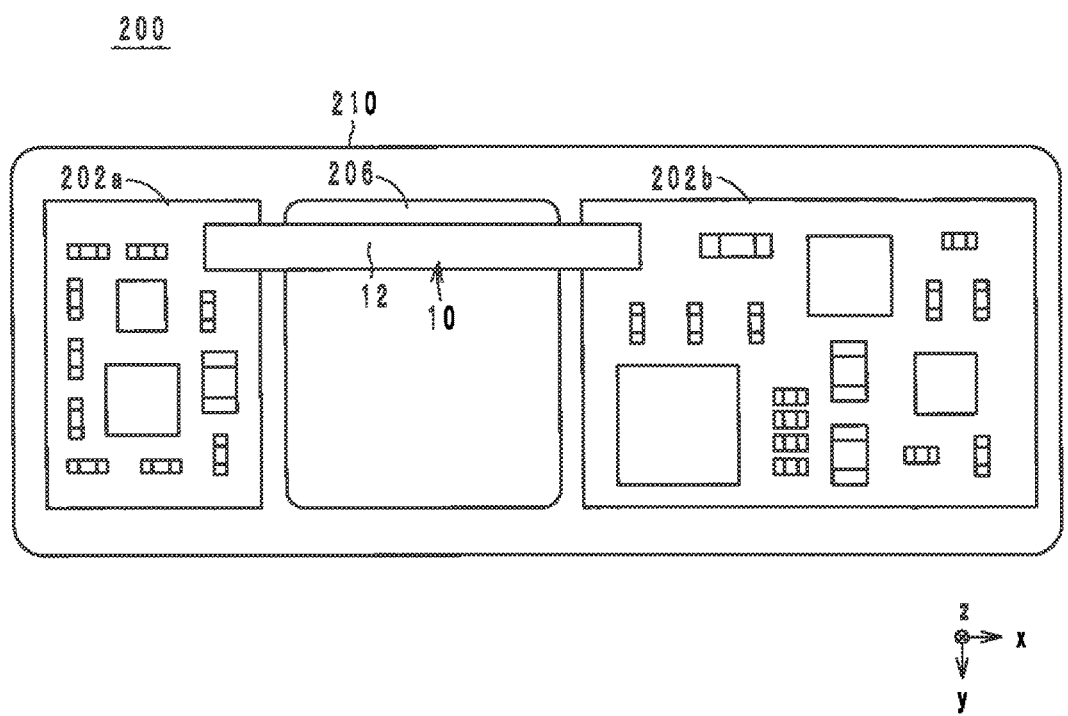
FIG. 6B illustrates the electronic device 200 provided with the high-frequency signal transmission line 10 as viewed in a plan view in the z-axis direction.

The high-frequency signal transmission line 10 is used in a manner as will be described below. FIG. 6A illustrates an electronic device 200 provided with the high-frequency signal transmission line 10 as viewed in a plan view in the y-axis direction. FIG. 6B illustrates the electronic device 200 provided with the high-frequency signal transmission line 10 as viewed in a plan view in the z-axis direction.

The electronic device 200 includes the high-frequency signal transmission line 10, circuit boards 202a and 202b, receptacles 204a and 204b, a battery pack 206, and a housing 210.

The housing 210 accommodates the high-frequency signal transmission line 10, the circuit boards 202a and 202b, the receptacles 204a and 204b, and the battery pack 206. The circuit board 202a is provided with, for example, a transmitter or receiver circuit including an antenna. The circuit board 202b is provided with, for example, a feed circuit. The battery pack 206 is, for example, a lithium-ion secondary battery, and the surface thereof is wrapped by a metal cover. The circuit board 202a, the battery pack 206, and the circuit board 202b are arranged in this order, from the negative side to the positive side in the x-axis direction.

The receptacles 204a and 204b are provided on the principal surfaces of the circuit boards 202a and 202b, respectively, on the negative side in the z-axis direction. The receptacles 204a and 204b are connected to the connectors 100a and 100b, respectively. As a result, high-frequency signals to be transmitted between the circuit boards 202a and 202b at a frequency of, for example, from 600 MHz to 6 GHz (in the present preferred embodiment, 2 GHz) are applied to the center conductors 108 of the connectors 100a and 100b via the receptacles 204a and 204b, respectively. Moreover, the external conductors 110 of the connectors 100a and 100b are kept at a ground potential by the circuit boards 202a and 202b and the receptacles 204a and 204b. Thus, the high-frequency signal transmission line 10 connects the circuit boards 202a and 202b both electrically and physically.

Here, the top surface of the dielectric element 12 (more precisely, the top surface of the protective layer 14) is in contact with the battery pack 206, as shown in FIG. 6A. The top surface of the dielectric element 12 and the battery pack 206 are fixed by an adhesive or the like. The top surface of the dielectric element 12 is a principal surface located on the ground conductor 22 side relative to the signal line 20. Accordingly, the ground conductor 22, which is in a contiguous form, i.e., the ground conductor 22 extends uninterruptedly in the x-axis direction, is located between the signal line 20 and the battery pack 206.

A non-limiting example of a method for producing the high-frequency signal transmission line 10 will be described below with reference to FIG. 2. In the following, an example where one high-frequency signal transmission line 10 is produced will be described, but in actuality, a plurality of high-frequency signal transmission lines 10 are produced simultaneously by stacking and cutting large-sized dielectric sheets.

Prepared first are dielectric sheets 18a to 18c made of a thermoplastic resin and copper-foiled entirely on their top surfaces. The copper-foiled top surfaces of the dielectric sheet 18a to 18c are smoothened, for example, by galvanization for rust prevention. The dielectric sheets 18a to 18c are sheets of liquid crystal polymer having a thickness of from about 50 μm to about 150 μm. The thickness of the copper foil is from about 10 μm to about 20 μm.

Next, external terminals 16a and 16b and a ground conductor 22, as shown in FIG. 2, are formed on the top surface of the dielectric sheet 18a by photolithography. Specifically, resists are printed on the copper foil of the dielectric sheet 18a in the same shapes as the external terminals 16a and 16b and the ground conductor 22 shown in FIG. 2. Then, any portions of the copper foil that are not coated with the resists are removed by etching the copper foil. Thereafter, the resists are removed. In this manner, the external terminals 16a and 16b and the ground conductor 22, as shown in FIG. 2, are formed on the top surface of the dielectric sheet 18a.

Next, a signal line 20, as shown in FIG. 2, is formed on the top surface of the dielectric sheet 18b by photolithography. Further, a ground conductor 24, as shown in FIG. 2, is formed on the top surface of the dielectric sheet 18c by photolithography. These photolithographic steps are essentially the same as the steps of forming the external terminals 16a and 16b and the ground conductor 22 by photolithography, and therefore, any descriptions thereof will be omitted.

Next, through-holes are provided in the dielectric sheets 18a and 18b by laser beam irradiation on their bottom surfaces where via-hole conductors b1, b2, and B1 to B4 are to be formed. Thereafter, the through-holes provided in the dielectric sheets 18a and 18b are filed with a conductive paste.

Next, the dielectric sheets 18a to 18c are stacked in this order, from the positive side to the negative side in the z-axis direction, such that the ground conductor 22, the signal line 20, and the ground conductor 24 form a stripline structure. Thereafter, the dielectric sheets 18a to 18c are heated and pressed from both the positive and negative sides in the z-axis direction and thus softened to be bonded and integrated together, and further, the conductive paste filling the through-holes is solidified so that the via-hole conductors b1, b2, and B1 to B4, as shown in FIG. 2, as formed. Note that the dielectric sheets 18a to 18c may be integrated, for example, by using an epoxy resin adhesive, rather than by the heating and pressing process. Alternatively, the via-hole conductors b1, b2, and B1 to B4 may be formed by providing through-holes in the dielectric sheets 18a to 18c having been integrated and filling the through-holes with a conductive paste or plating the through-holes.

Next, a resin (resist) paste is applied to the top surface of the dielectric sheet 18a, thus forming a protective layer 14 thereon. Lastly, connectors 100a and 100b are respectively mounted on the top surfaces of the connecting portions 12b and 12c by solder. As a result, the high-frequency signal transmission line 10 as shown in FIG. 1 is obtained.

The high-frequency signal transmission line 10 and the electronic device 200 render it possible to reduce insertion loss. More specifically, as for the high-frequency signal line described in International Publication No. 2012/074101, the entire signal line generates an essentially uniform characteristic impedance (e.g., 50Ω).

On the other hand, the signal line 20 includes the sections A1 and A2. The section A1 generates a characteristic impedance greater than or equal to the characteristic impedance Z1 (e.g., 50Ω) generated at the end of the signal line 20 on the negative side in the x-axis direction, and includes the end of the signal line 20 on the positive side in the x-axis direction. Further, the section A2 generates a characteristic impedance less than the characteristic impedance Z1, and is adjacent to the section A1. That is, in a portion of the signal line 20 of the high-frequency signal transmission line 10 (i.e., the section A2), the signal line 20 generates a characteristic impedance less than the characteristic impedance Z1 generated at the end of the signal line 20 on the negative side in the x-axis direction. Accordingly, the high-frequency signal transmission line 10 achieves reduced transmission loss in the section A2 compared to the high-frequency signal line described in International Publication No. 2012/074101. Thus, the high-frequency signal transmission line 10 can reduce insertion loss compared to the high-frequency signal line described in International Publication No. 2012/074101.

Furthermore, to reduce the transmission loss in the section A2, the high-frequency signal transmission line 10 is designed such that the characteristic impedance generated in the section A2 is less than the characteristic impedance Z1 generated at the end of the signal line 20 on the positive side in the x-axis direction. More specifically, to this end, the high-frequency signal transmission line 10 is designed such that the width w2 of the signal line 20 in the section A2 is greater than the width w1 of the signal line 20 in the section A1. As a result, the resistance of the signal line 20 in the section A2 is reduced. Thus, conductor loss to be generated when a high-frequency signal is transmitted through the section A2 is reduced, resulting in reduced insertion loss in the high-frequency signal transmission line 10.

Furthermore, in the high-frequency signal transmission line 10, the width of the signal line 20 changes continuously in the impedance changing section a1, and therefore, the characteristic impedance of the impedance changing section a1 changes continuously as well. Thus, the characteristic impedance generated in the impedance changing section a1 is prevented from changing abruptly, thus preventing high-frequency signal reflection in the impedance changing section a1.

Furthermore, the high-frequency signal transmission line 10 achieves reduced insertion loss also for the reasons stated below. Specifically, it is conceivable that the high-frequency signal transmission line is provided with a balun, for example, in a portion corresponding to the impedance changing section a1, in order to change the characteristic impedance generated in the signal line. However, the balun causes transmission loss, resulting in increased insertion loss in the high-frequency signal transmission line.

The characteristic impedance of the high-frequency signal transmission line 10 is generated by the signal line 20, the ground conductors 22 and 24, and the dielectric element 12. Accordingly, the high-frequency signal transmission line 10 does not use a circuit, such as a balun, which does not include the signal line 20, the ground conductors 22 and 24, and the dielectric element 12, for the purpose of changing the characteristic impedance generated in the impedance changing section a1. Thus, the high-frequency signal transmission line 10 achieves reduced insertion loss.

Furthermore, the length of the impedance changing section a1 is set to be greater than or equal to about ⅕ or about ¼ of the wavelength of the high-frequency signal to be transmitted through the signal line 20, thus preventing the impedance changing section a1 from functioning as an incommensurate element. That is, high-frequency signal reflection in the impedance changing section a1 is prevented. As a result, the insertion loss in the high-frequency signal transmission line 10 is reduced. Note that there is no upper limit to the length of the impedance changing section a1. However, in the case where the high-frequency signal transmission line 10 is used in the electronic device 200, the high-frequency signal transmission line 10 is required to have an appropriate length. Therefore, from the viewpoint of practical use, the upper limit to the length of the impedance changing section a1 is preferably about twice the wavelength of the high-frequency signal to be transmitted through the signal line 20, for example.

First Modification

Hereinafter, a high-frequency signal transmission line 10a according to a first modification of a preferred embodiment of the present invention will be described with reference to the drawings. FIG. 7A is an exploded view of a dielectric element 12 of the high-frequency signal transmission line 10a.

The high-frequency signal transmission line 10a is different from the high-frequency signal transmission line 10 in that the signal line 20 includes sections A1, A2, and A3. More specifically, in the high-frequency signal transmission line 10a, the section A2 does not include the end of the signal line 20 on the positive side in the x-axis direction. Instead, the section A3 includes the end of the signal line 20 on the positive side in the x-axis direction, and is adjacent to the section A2. That is, the section A3 extends toward the positive side in the x-axis direction starting from the end of the section A2 on the positive side in the x-axis direction. Moreover, the section A3 is an uninterrupted section generating a characteristic impedance greater than or equal to a characteristic impedance Z4 (e.g., 50Ω) generated at the end of the signal line 20 on the positive side in the x-axis direction. In the present preferred embodiment, the characteristic impedance generated in the section A3 is equal or substantially equal to the characteristic impedance Z4.

The section A2 generates a characteristic impedance less than either the characteristic impedance Z1 or Z4, and is adjacent to both the sections A1 and A3. That is, the section A2 is sandwiched between the sections A1 and A3. In addition, the section A2 is longer than either the section A1 or A3. In the present preferred embodiment, the section A2 is longer than a combined length of the sections A1 and A3.

Furthermore, the section A2 includes impedance changing sections a1 and a3 and an impedance unchanging section a2. The impedance changing section a1 is adjacent to the section A1, and extends toward the positive side in the x-axis direction starting from the end of the section A1 on the positive side in the x-axis direction. The characteristic impedance generated in the impedance changing section a1 decreases toward the farthest end from the section A1 (i.e., toward the end on the positive side in the x-axis direction). The impedance changing section a2 is adjacent to the impedance changing section a1, and extends toward the positive side in the x-axis direction starting from the end of the impedance changing section a1 on the positive side in the x-axis direction. The impedance unchanging section a2 generates an essentially uniform characteristic impedance Z10 (e.g., 30Ω). The impedance changing section a3 is adjacent to the impedance unchanging section a2, and extends toward the positive side in the x-axis direction starting from the end of the impedance unchanging section a2 on the positive side in the x-axis direction. The characteristic impedance generated in the impedance changing section a3 increases toward the farthest end from the section A2 (i.e., toward the end on the positive side in the x-axis direction).

Furthermore, the length of the impedance changing section a3, as with the length of the impedance changing section a1, is preferably greater than or equal to about ⅕, more preferably greater than or equal to about ¼, of the wavelength of the high-frequency signal to be transmitted through the signal line 20. In addition, the length of the impedance changing section a3, as with the length of the impedance changing section a1, is preferably less than or equal to about twice the wavelength of the high-frequency signal to be transmitted through the signal line 20.

In the high-frequency signal transmission line 10a, the width of the signal line 20 varies between the sections in order to generate the characteristic impedances described above. More specifically, the signal line 20 has the width w1 in both the sections A1 and A3. In the impedance unchanging section a2, the signal line 20 has the width w2, which is greater than the width w1. In this manner, the signal line 20 is relatively narrow in the sections A1 and A3, and therefore, the area of the signal line 20 that overlaps the ground conductors 22 and 24 per unit length is relatively small. Accordingly, in the sections A1 and A3, the capacitance generated between the signal line 20 and the ground conductors 22 and 24 per unit length is relatively low, so that the characteristic impedance Z1 of the high-frequency signal transmission line 10a becomes relatively high. On the other hand, in the impedance unchanging section a2, the signal line 20 is relatively wide, and therefore, the area of the signal line 20 that overlaps the ground conductors 22 and 24 per unit length is relatively large. Accordingly, in the impedance unchanging section a2, the capacitance generated between the signal line 20 and the ground conductors 22 and 24 per unit length is relatively high, so that the characteristic impedance Z10 of the high-frequency signal transmission line 10a becomes relatively low.

Furthermore, the signal line 20 has the width w1 at the end of the impedance changing section a1 on the negative side in the x-axis direction, and the signal line 20 has the width w2 at the end of the impedance changing section a1 on the positive side in the x-axis direction. That is, the width of the signal line 20 in the impedance changing section a1 increases from the negative side in the x-axis direction toward the positive side (i.e., toward the farthest end from the section A1). In addition, the width of the signal line 20 in the impedance changing section a1 changes continuously. As a result, the characteristic impedance generated in the impedance changing section a1 decreases continuously from the characteristic impedance Z1 to the characteristic impedance Z10 from the negative side in the x-axis direction toward the positive side.

Furthermore, the signal line 20 has the width w2 at the end of the impedance changing section a3 on the negative side in the x-axis direction, and also has the width w1 at the end of the impedance changing section a3 on the positive side in the x-axis direction. That is, the width of the signal line 20 in the impedance changing section a3 decreases from the negative side in the x-axis direction toward the positive side (i.e., toward the farthest end from the section A2). In addition, the width of the signal line 20 in the impedance changing section a3 changes continuously. As a result, the characteristic impedance generated in the impedance changing section a3 increases continuously from the characteristic impedance Z10 to the characteristic impedance Z4 from the negative side in the x-axis direction toward the positive side.

The characteristic impedance of the high-frequency signal transmission line 10a is generated by the signal line 20, the ground conductors 22 and 24, and the dielectric element 12. Accordingly, the high-frequency signal transmission line 10 does not use a circuit, such as a balun, which does not include the signal line 20, the ground conductors 22 and 24, and the dielectric element 12, for the purpose of changing the characteristic impedance generated in the impedance changing sections a1 and a3.

The high-frequency signal transmission line 10a having such a structure also achieves the same effects as those achieved by the high-frequency signal transmission line 10.

Figure 7B:
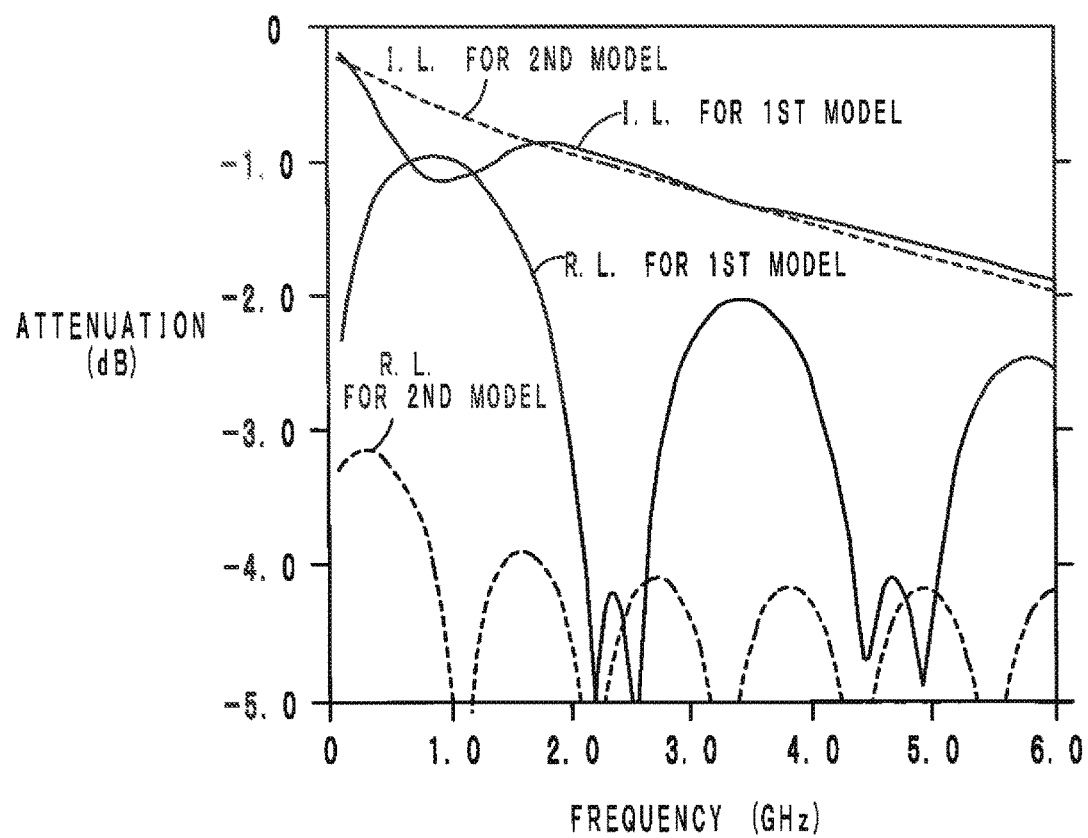
FIG. 7B is a graph showing simulation results.

The present inventor carried out a computer simulation to be described below in order to demonstrate that the high-frequency signal transmission line 10a achieves reduced insertion loss and also in order to determine an appropriate length of the impedance changing section a3. Specifically, the present inventor made a high-frequency signal transmission line 10a as a first model and a high-frequency signal transmission line according to a comparative example as a second model. The high-frequency signal transmission line according to the comparative example includes a signal line with a uniform width to generate a uniform characteristic impedance. The relationship of insertion loss (IL) and return loss (RL) over frequency was studied for both the first model and the second model. Insertion loss is a value for the ratio of output signal power to input signal power. Return loss is a value for the ratio of reflected signal power to input signal power. FIG. 7B is a graph showing the simulation results where the vertical axis represents attenuation and the horizontal axis represents frequency.

It can be appreciated from FIG. 7B that the first model has less insertion loss than the second model for the frequency band of from 1.8 GHz upward. Accordingly, it can be appreciated that the high-frequency signal transmission line 10a achieves reduced insertion loss.

The difference in insertion loss between the first model and the second model is small around 3.3 GHz, as shown in FIG. 7B. The reason for this is that return loss in the first model increases around 3.3 GHz. On the other hand, the difference in insertion loss between the first model and the second model increases around 2.5 GHz and also around 4.7 GHz, as shown in FIG. 7B. The reason for this is that return loss in the first model decreases around 2.5 GHz and also around 4.7 GHz. Therefore, the high-frequency signal transmission line 10a is designed such that the position of the dip in return loss for the first model in FIG. 7B corresponds to the frequency of the high-frequency signal to be transmitted through the signal line 20.

Furthermore, it can be appreciated from FIG. 7B that the first model has more insertion loss than the second model for the frequency band of from 1.8 GHz downward and less insertion loss for the frequency band higher than 1.8 GHz. The cause of such a phenomenon is due to the relationship between the length of the impedance changing sections a1 and a3 and the high-frequency signal transmitted through the signal line 20. More specifically, when the length of the impedance changing sections a1 and a3 is an integral multiple of ¼ of the wavelength of the high-frequency signal to be transmitted through the signal line 20, signal reflection in the impedance changing sections a1 and a3 is prevented, resulting in reduced return loss in the first model. Accordingly, the length of the impedance changing sections a1 and a3 is preferably greater than or equal to about ¼, more preferably an integral multiple of ¼, of the wavelength of the high-frequency signal to be transmitted through the signal line 20. Note that in the present preferred embodiment, the length of the impedance changing sections a1 and a3 is preferably set at about ¼ of the wavelength of a 2.5-GHz high-frequency signal (i.e., the length is set at the wavelength of a high-frequency signal at about 10 GHz), for example. Accordingly, insertion loss in the first model decreases at about 2.5 GHz, for example.

Furthermore, the high-frequency signal transmission line 10a achieves reduced insertion loss by increasing the width of the signal line 20 in the section A2. The advantage of reducing insertion loss by increasing the width of the signal line 20 in the section A2 is cancelled out at a frequency of 1.8 GHz by the disadvantage of increasing return loss due to the length of the impedance changing sections a1 and a3 being shorter than about ¼ of the wavelength of the high-frequency signal to be transmitted through the signal line 20. As described earlier, the length of the impedance changing sections a1 and a3 is preferably set at the wavelength of the high-frequency signal at about 10 GHz, for example. In other words, the length of the impedance changing sections a1 and a3 is preferably set at about ⅕ of the wavelength of the 1.8-GHz high-frequency signal, for example. Therefore, the length of the impedance changing sections a1 and a3 may be set to be greater than or equal to about ⅕ of the wavelength of the high-frequency signal to be transmitted through the signal line 20.

Second Modification

Figure 8A:
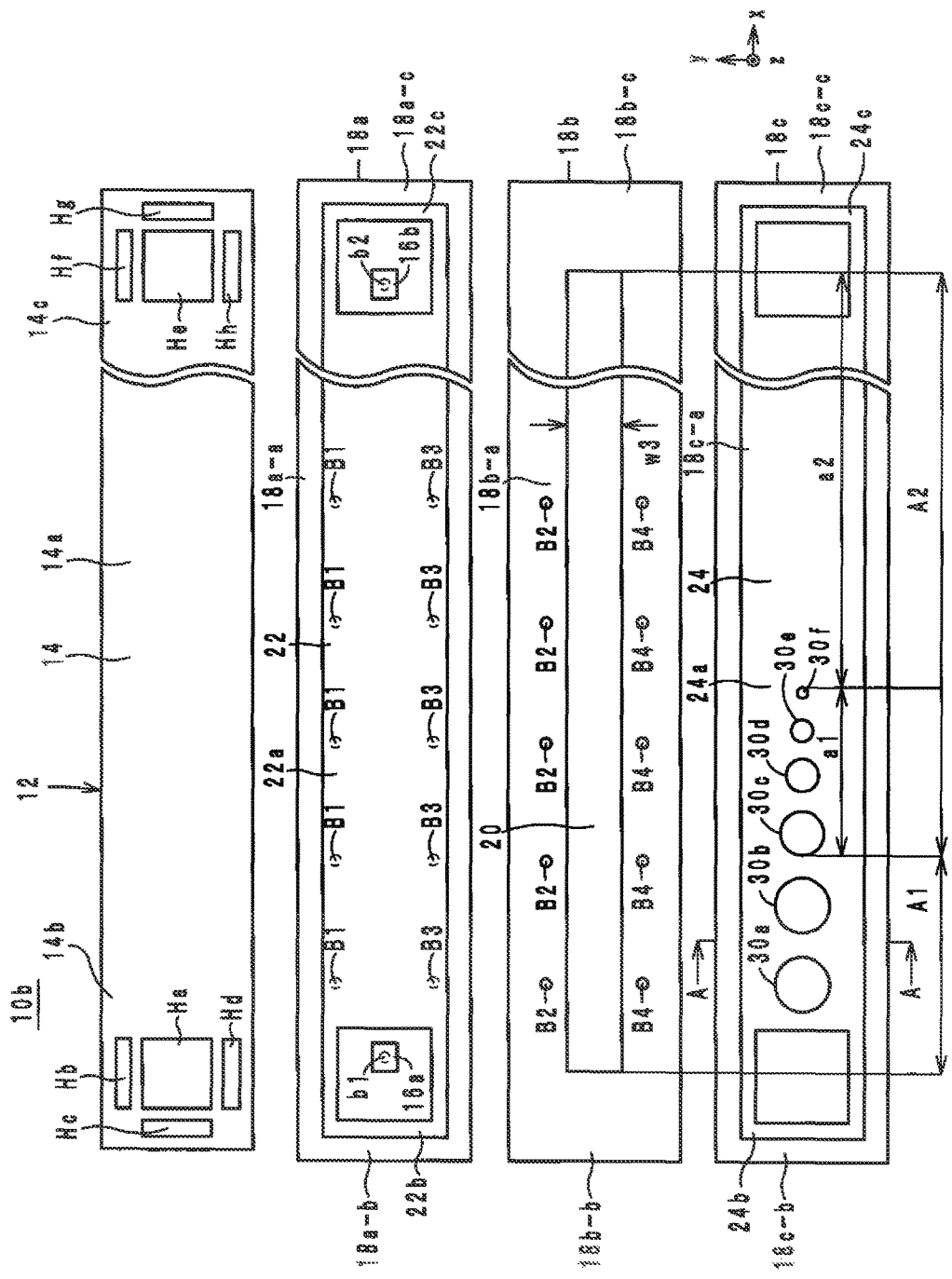
FIG. 8A is an exploded view of a dielectric element 12 of a high-frequency signal transmission line 10b.
Figure 8B:
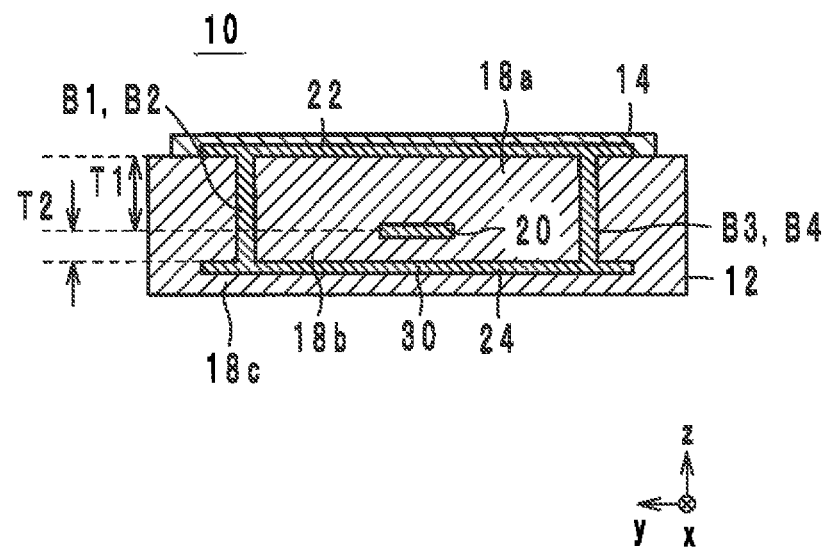
FIG. 8B is a cross-sectional structure view of the high-frequency signal transmission line 10b taken along line A-A in FIG. 8A.
Figure 8C:
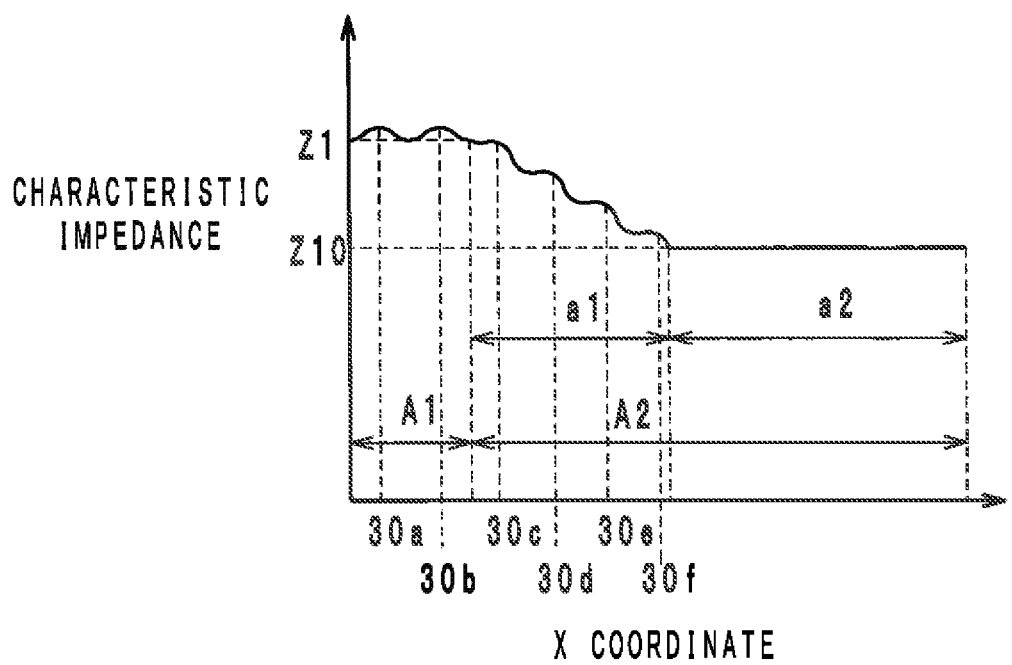
FIG. 8C is a graph showing the characteristic impedance of the high-frequency signal transmission line 10b.

Hereinafter, a high-frequency signal transmission line 10b according to a second modification of a preferred embodiment of the present invention will be described with reference to the drawings. FIG. 8A is an exploded view of a dielectric element 12 of the high-frequency signal transmission line 10b. FIG. 8B is a cross-sectional structure view of the high-frequency signal transmission line 10b taken along line A-A in FIG. 8A. FIG. 8C is a graph showing the characteristic impedance of the high-frequency signal transmission line 10b. In FIG. 8C, the vertical axis represents the characteristic impedance and the horizontal axis represents the x-coordinate.

The high-frequency signal transmission line 10b is different from the high-frequency signal transmission line 10 in the following three points. The first difference is that the width of the signal line 20 is uniform. The second difference is that the ground conductor 24 is provided with openings 30a, 30b, 30c, 30d, 30e, and 30f. The third difference is that the signal line 20 is provided closer to the ground conductor 24 than to the ground conductor 22.

The high-frequency signal transmission line 10b will be described below mainly focusing on these differences.

As for the first difference, the signal line 20 has a uniform width w3, as shown in FIG. 8A. The width w3 is greater than either the width w1 or w2.

As for the second difference, the ground conductor 24 is provided with the openings 30a to 30f arranged along the signal line 20, as shown in FIG. 8A. The openings 30a to 30f, when viewed in a plan view in the z-axis direction, overlap the signal line 20, and are arranged in this order from the negative side to the positive side in the x-axis direction. The openings 30a to 30f are circular. The openings 30a and 30b have the same diameter, and are the largest in diameter among all of the openings 30a to 30f. Moreover, the openings 30c to 30f are in descending order of diameter. Accordingly, the openings 30a and 30b are the largest in overlapping area with the signal line 20 among all of the openings 30a to 30f. Moreover, the openings 30c to 30f are in descending order of overlapping area with the signal line 20.

As for the third difference, the signal line 20 is provided closer to the ground conductor 24 than to the ground conductor 22, as shown in FIG. 8B.

In the high-frequency signal transmission line 10b, the openings 30a to 30f are provided so that the section of the ground conductor 24 with the openings 30a to 30f is smaller in area facing the signal line 20 than the rest of the ground conductor 24. Accordingly, the capacitance generated between the signal line 20 and the ground conductor 24 is lower in the section with the openings 30a to 30f than in the rest of the ground conductor 24. As a result, the characteristic impedance generated in the section with the openings 30a to 30f is higher than in the rest of the ground conductor 24.

Furthermore, the openings 30a and 30b are the largest in diameter among all of the openings 30a to 30f. In addition, the openings 30c to 30f are in descending order of diameter. The openings 30a and 30b are the largest in overlapping area with the signal line 20 among all of the openings 30a to 30f. In addition, the openings 30c to 30f are in descending order of overlapping area with the signal line 20. Accordingly, the characteristic impedance of the high-frequency signal transmission line 10b changes as shown in FIG. 8C. More specifically, in the section with the openings 30a and 30b, the characteristic impedance of the high-frequency signal transmission line 10b repeatedly increases and decreases in the range above the characteristic impedance Z1. In the section with the openings 30c to 30f, the characteristic impedance of the high-frequency signal transmission line 10b decreases from the characteristic impedance Z1 to the characteristic impedance Z10 while repeatedly increasing and decreasing. The characteristic impedance of the high-frequency signal transmission line 10b is the characteristic impedance Z10 in the section without openings.

In the high-frequency signal transmission line 10b, the section stretching from the end of the signal line 20 on the negative side in the x-axis direction to the end of the opening 30c on the negative side in the x-axis direction corresponds to the section A1, as shown in FIG. 8A. Moreover, the section stretching from the end of the opening 30c on the negative side in the x-axis direction to the end of the opening 30f on the positive side in the x-axis direction corresponds to the impedance changing section a1. In addition, the section stretching from the end of the opening 30f on the positive side in the x-axis direction to the end of the signal line 20 on the positive side in the x-axis direction corresponds to the impedance unchanging section a2.

Furthermore, the high-frequency signal transmission line 10b is provided with the openings 30a to 30f so that the capacitance generated between the signal line 20 and the ground conductor 24 is reduced. As a result, the characteristic impedance of the high-frequency signal transmission line 10b might become excessively low in the section with the openings 30a to 30f. Therefore, in the high-frequency signal transmission line 10b, when compared to the high-frequency signal transmission line 10, the distance between the signal line 20 and the ground conductor 24 is reduced, and the width of the signal line 20 is increased.

The high-frequency signal transmission line 10b having such a structure achieves the same effects as those achieved by the high-frequency signal transmission line 10.

Furthermore, the high-frequency signal transmission line 10b is rendered thinner while achieving reduced insertion loss. More specifically, the ground conductor 24 is provided with the openings 30a to 30f so that the distance between the signal line 20 and the ground conductor 24 can be reduced, thus rendering the high-frequency signal transmission line 10b thinner. However, providing the ground conductor 24 with the openings 30a to 30f generates radiation loss, resulting in increased insertion loss in the high-frequency signal transmission line 10b. Radiation loss refers to loss generated by the signal line 20 radiating noise through the openings to the outside of the high-frequency signal transmission line 10b.

Therefore, the openings 30c to 30f are provided in the impedance changing section a1 in descending order of area toward the farthest end from the section A1. Accordingly, the radiation loss in the impedance changing section a1 decreases toward the farthest end from the section A1. Moreover, the radiation loss is significantly reduced or minimized in the impedance unchanging section a2 because no openings are provided in the impedance unchanging section a2. That is, the generation of radiation loss is significantly reduced or prevented in the section A2. In this manner, the high-frequency signal transmission line 10b is provided with the openings 30a to 30f, so that the high-frequency signal transmission line 10b is rendered thinner, and further, the openings 30a to 30f are provided in various sizes so as to reduce radiation loss in the section A2. Thus, the high-frequency signal transmission line 10b is rendered thinner while achieving reduced insertion loss.

Furthermore, in the high-frequency signal transmission line 10b, the signal line 20 is wider, and therefore, the conductor loss generated when the signal line 20 transmits a high-frequency signal therethrough is reduced. Thus, the high-frequency signal transmission line 10b achieves reduced insertion loss.

Furthermore, the high-frequency signal transmission line 10b allows the signal line 20 and the ground conductor 24 to be positioned closer to each other, so that the dielectric element 12 is rendered thinner. Thus, the high-frequency signal transmission line 10b is able to be bent readily.

Third Modification

Figure 9A:
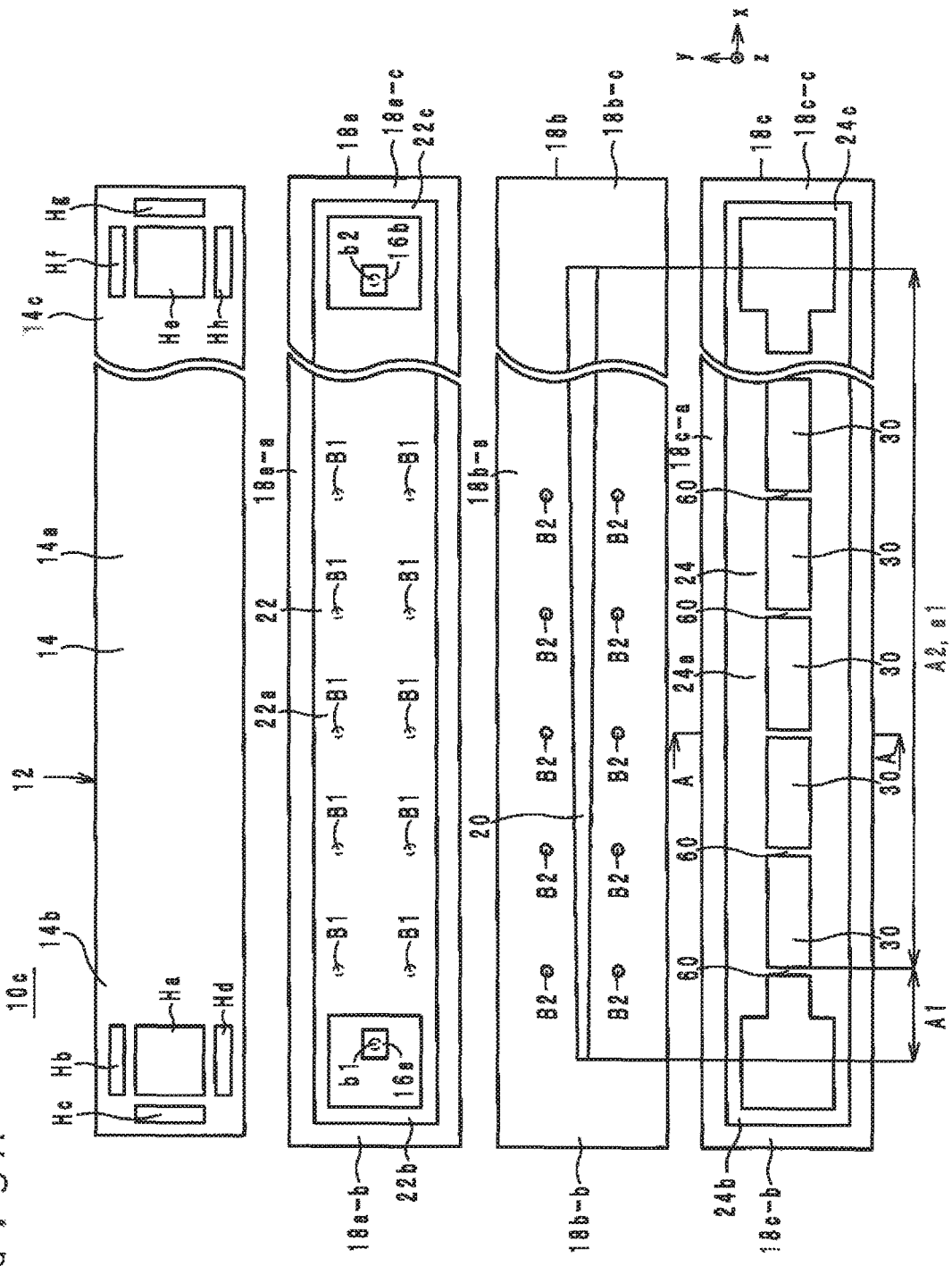
FIG. 9A is an exploded view of a dielectric element 12 of a high-frequency signal transmission line 10c.
Figure 9B:
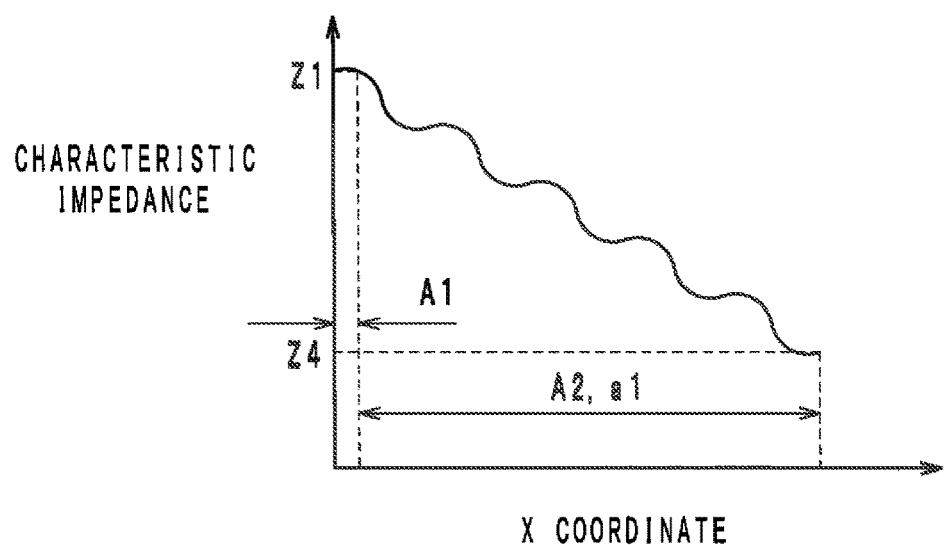
FIG. 9B is a graph showing the characteristic impedance of the high-frequency signal transmission line 10c.

Hereinafter, a high-frequency signal transmission line 10c according to a third modification of a preferred embodiment of the present invention will be described with reference to the drawings. FIG. 9A is an exploded view of a dielectric element 12 of the high-frequency signal transmission line 10c. FIG. 9B is a graph showing the characteristic impedance of the high-frequency signal transmission line 10c. For the cross-sectional structure view of the high-frequency signal transmission line 10c, FIG. 8C will be referenced.

The high-frequency signal transmission line 10c is different from the high-frequency signal transmission line 10 in the following three points. The first difference is that the signal line 20 becomes wider from the negative side in the x-axis direction toward the positive side. The second difference is that the ground conductor 24 is provided with a plurality of openings 30. The third difference is that the signal line 20 is provided closer to the ground conductor 24 than to the ground conductor 22.

The high-frequency signal transmission line 10c will be described below mainly focusing on these differences.

As for the first difference, the signal line 20 continues to become wider from the negative side in the x-axis direction toward the positive side, as shown in FIG. 9A.

As for the second difference, the ground conductor 24 is provided with the openings 30 arranged along the signal line 20, as shown in FIG. 9A. The openings 30 are in the form of rectangles overlapping the signal line 20 when viewed in a plan view in the z-axis direction. Accordingly, the ground conductor 24 preferably has a ladder-shaped configuration. Each portion of the ground conductor 24 that is located between the openings 30 at opposite ends in the x-axis direction will be referred to below as a "bridge portion 60".

As for the third difference, the signal line 20 is provided closer to the ground conductor 24 than to the ground conductor 22, as shown in FIG. 8B.

In the high-frequency signal transmission line 10c, the capacitance generated between the signal line 20 and the ground conductor 24 is lower at the openings 30 than at the bridge portions 60. Accordingly, the characteristic impedance of the high-frequency signal transmission line 10c is higher at the openings 30 than at the bridge portions 60. The signal line 20 alternatingly overlaps the openings 30 and the bridge portions 60. Therefore, the characteristic impedance of the high-frequency signal transmission line 10c repeatedly increases and decreases, as shown in FIG. 9B.

However, the signal line 20 becomes wider from the negative side in the x-axis direction toward the positive side. Accordingly, the capacitance generated between the signal line 20 and the ground conductor 24 increases from the negative side in the x-axis direction toward the positive side. Therefore, the characteristic impedance of the high-frequency signal transmission line 10c becomes lower from the negative side in the x-axis direction toward the positive side while repeatedly increasing and decreasing, as shown in FIG. 9B.

In the high-frequency signal transmission line 10c, the characteristic impedance of the high-frequency signal transmission line 10c is the characteristic impedance Z1 at the end of the signal line 20 on the negative side in the x-axis direction, and increases slightly toward the positive side in the x-axis direction, as shown in FIG. 9B. The section A1 continues from the end of the signal line 20 on the negative side in the x-axis direction up to a point at which the characteristic impedance initially reaches the characteristic impedance Z1 on the positive side in the x-axis direction relative to the end of the signal line 20 on the negative side in the x-axis. That is, the section A1 is an uninterrupted section in which the characteristic impedance Z1 or higher continues to be generated. In the present preferred embodiment, the section A1 stretches from the end of the signal line 20 on the negative side in the x-axis direction to the farthermost one of the bridge portions 60 on the negative side in the x-axis direction.

Furthermore, the section A2 is a section stretching from the end of the section A1 on the positive side in the x-axis direction to the end of the signal line 20 on the positive side in the x-axis direction. Note that the characteristic impedance generated in the section A2 essentially decreases. Accordingly, the high-frequency signal transmission line 10c has no impedance unchanging section a2. Therefore, in the high-frequency signal transmission line 10c, the section A2 and the impedance changing section a1 are equivalent to each other.

The high-frequency signal transmission line 10c having such a structure achieves the same effects as those achieved by the high-frequency signal transmission line 10.

Furthermore, the high-frequency signal transmission line 10c allows the signal line 20 and the ground conductor 24 to be positioned closer to each other, so that the dielectric element 12 is rendered thinner. Thus, the high-frequency signal transmission line 10b is able to be bent readily.

Incidentally, the present inventor carried out a computer simulation to be described below in order to demonstrate that the high-frequency signal transmission line 10c achieves reduced insertion loss. Specifically, the present inventor made third through fifth models to be described below.

The third model has the configuration of the high-frequency signal transmission line 10c. Note that the characteristic impedance Z1 is 50Ω, and the characteristic impedance Z4 is 30Ω.

The fourth model has the configuration of the high-frequency signal line described in International Publication No. 2012/074101. The characteristic impedance of this high-frequency signal line is constant at 50Ω.

The fifth model is the high-frequency signal line described in International Publication No. 2012/074101 with a balun. This signal line has a characteristic impedance of 50Ω at one end and a characteristic impedance of 30Ω at the other end.

Figure 10A:
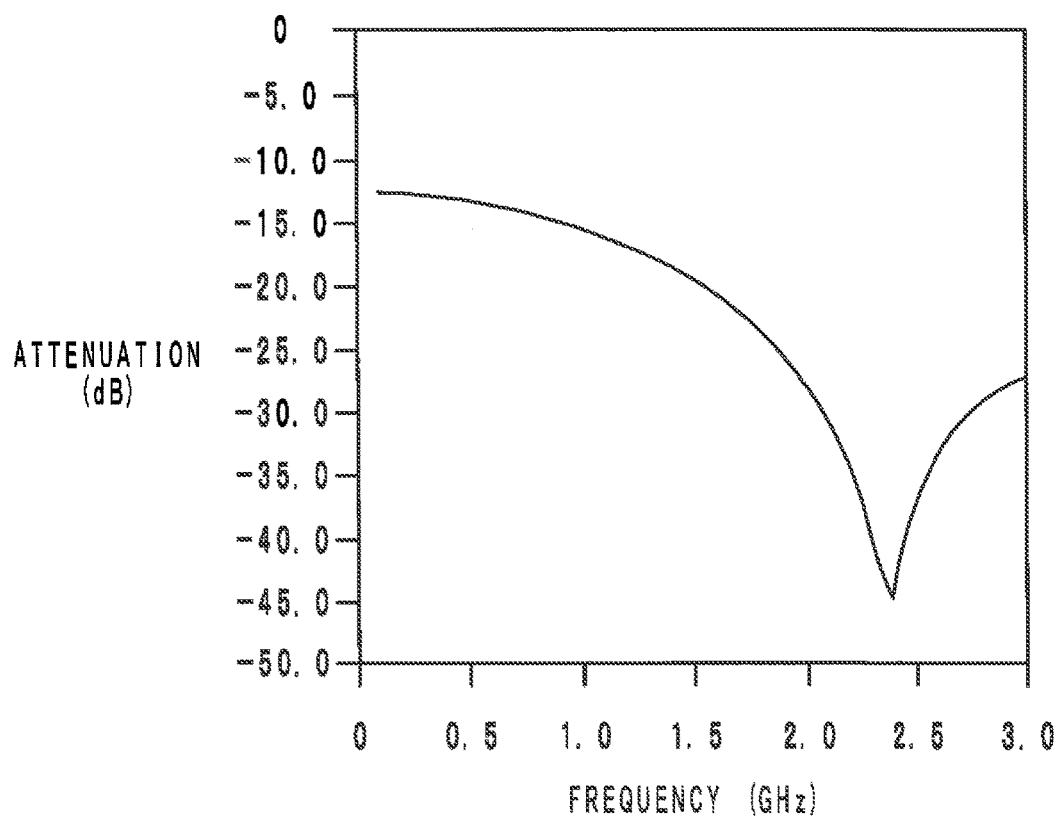
FIG. 10A is a graph showing the reflection characteristic of a third model.
Figure 10B:
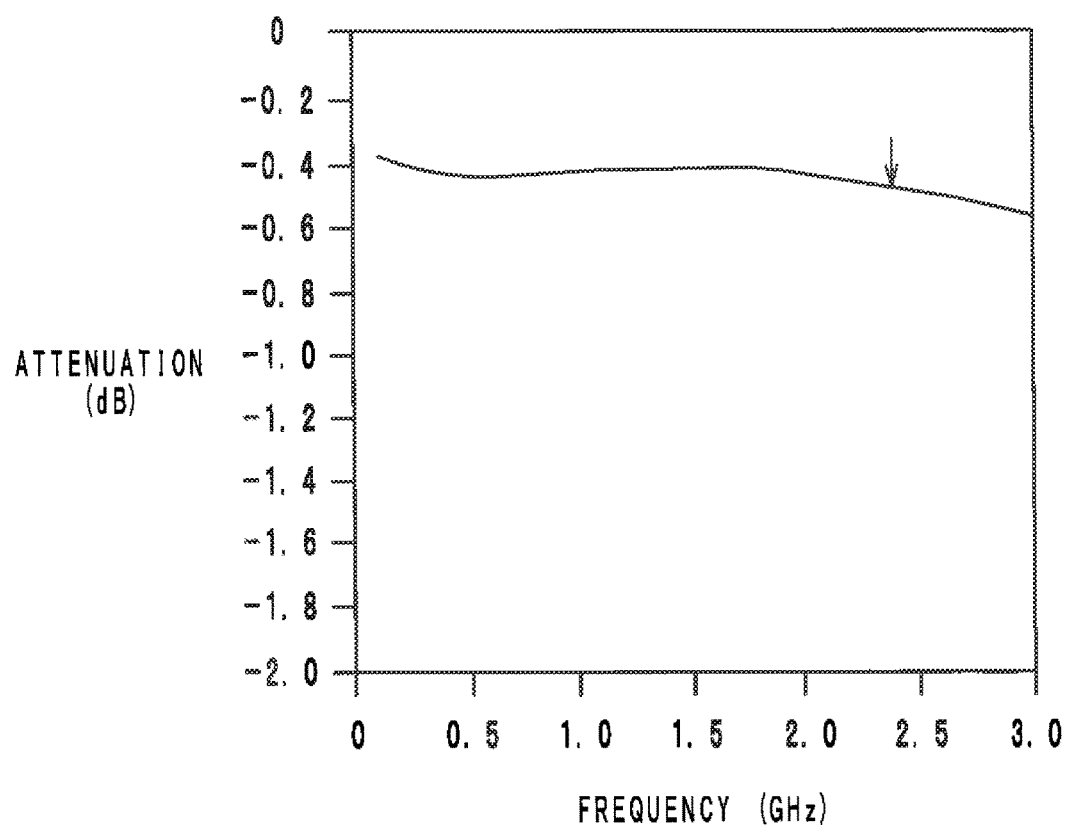
FIG. 10B is a graph showing the pass characteristic of the third model.
Figure 11A:
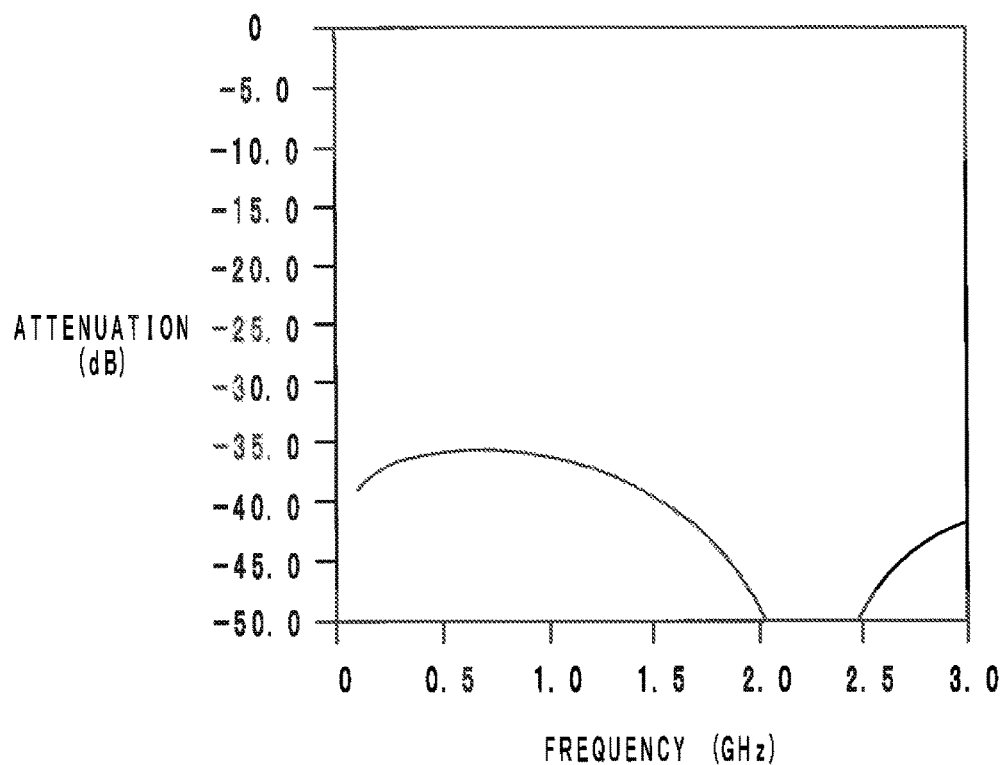
FIG. 11A is a graph showing the reflection characteristic of a fourth model.
Figure 11B:
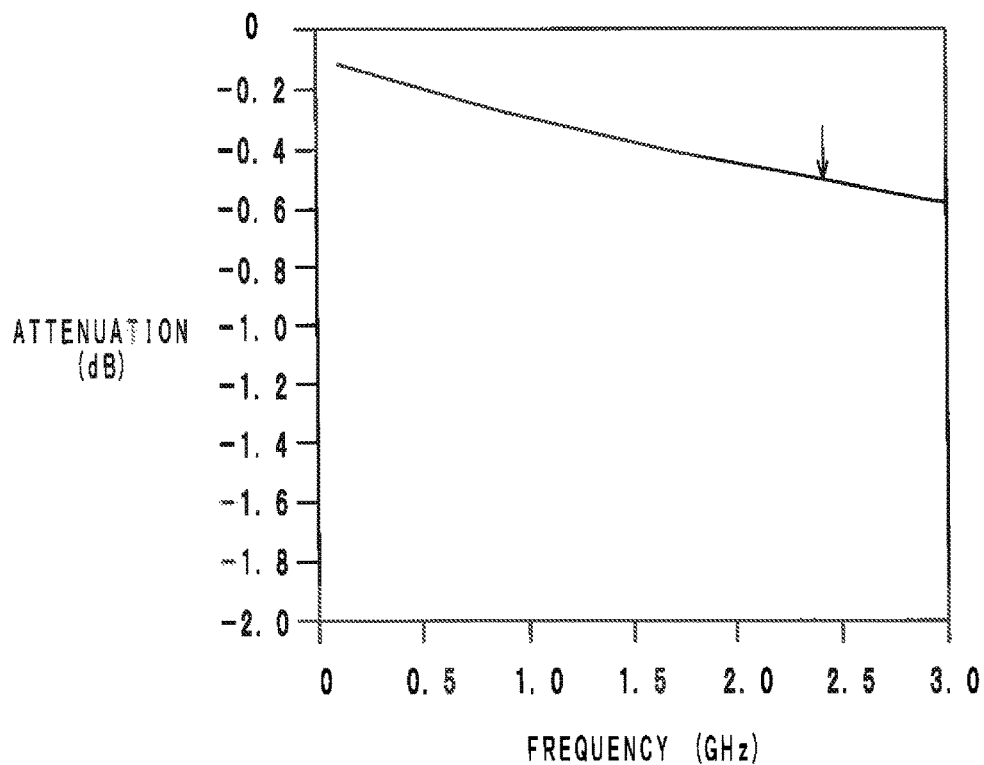
FIG. 11B is a graph showing the pass characteristic of the fourth model.
Figure 12A:
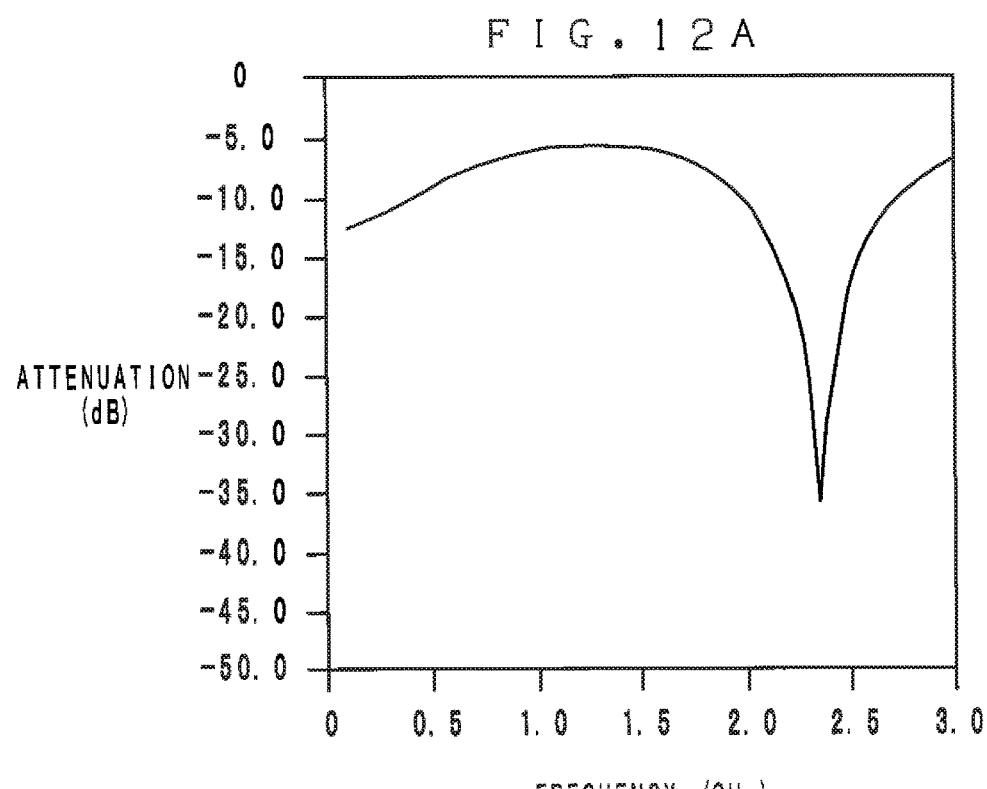
FIG. 12A is a graph showing the reflection characteristic of a fifth model.
Figure 12B:
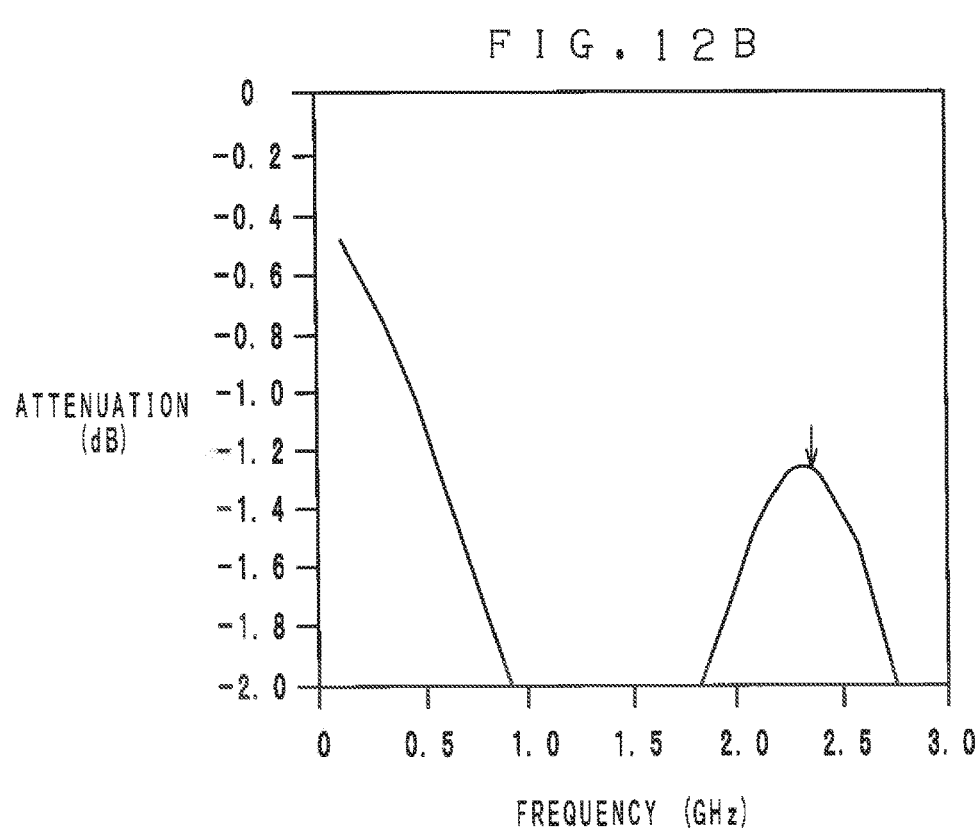
FIG. 12B is a graph showing the pass characteristic of the fifth model.

The present inventor studied the relationship of reflection characteristic and pass characteristic over frequency for the third through fifth models. FIG. 10A is a graph showing the reflection characteristic of the third model. FIG. 10B is a graph showing the pass characteristic of the third model. FIG. 11A is a graph showing the reflection characteristic of the fourth model. FIG. 11B is a graph showing the pass characteristic of the fourth model. FIG. 12A is a graph showing the reflection characteristic of the fifth model. FIG. 12B is a graph showing the pass characteristic of the fifth model. Pass characteristic is a value for the ratio of output signal intensity at the external terminal 16b to input signal intensity at the external terminal 16a. Reflection characteristic is a value for the ratio of reflected signal intensity at the external terminal 16a to input signal intensity at the external terminal 16a.

As for the third model, the reflection characteristic is best at 2.4 GHz. The pass characteristic of the third model is −0.477 dB at 2.4 Hz.

As for the fourth model, the reflection characteristic is best at 2.4 GHz. The pass characteristic of the fourth model is −0.504 dB at 2.4 GHz.

As for the fifth model, the reflection characteristic is best at 2.4 GHz. The pass characteristic of the fifth model is −1.307 dB at 2.4 GHz.

From the foregoing, it can be appreciated that the pass characteristic of the third model at 2.4 GHz is better than the pass characteristic of each of the fourth and fifth models at 2.4 GHz. Accordingly, it can be appreciated that the high-frequency signal transmission line 10c achieves reduced insertion loss compared to both the high-frequency signal line described in International Publication No. 2012/074101 and the high-frequency signal line with a balun.

Other Preferred Embodiments

The present invention is not limited to the high-frequency signal transmission lines 10 and 10a to 10c, and variations can be made within the spirit and scope of the present invention.

The high-frequency signal transmission lines 10 and 10a to 10c may only have either one of the ground conductors 22 and 24. That is, the high-frequency signal transmission lines 10 and 10a to 10c may be micro-stripline structures.

Moreover, the dielectric element 12 does not have to be a stack of layers. For example, the dielectric element 12 may be a cable having a circular cross section as with coaxial cables. In such a case, an external conductor having an annular cross section is provided so as to surround the signal line.

Furthermore, the high-frequency signal transmission line 10c does not have to be provided with the openings 30. In such a case, the characteristic impedance of the high-frequency signal transmission line 10c decreases linearly from the characteristic impedance Z1 to the characteristic impedance Z4. Accordingly, the section A1 does not continue from the end of the signal line 20 on the negative side in the x-axis direction. In addition, the section A2 spans the entire signal line 20 excluding the end on the negative side in the x-axis direction. Moreover, the impedance changing section a2 does not exist.

The configurations of the high-frequency signal transmission lines 10 and 10a to 10c may be combined arbitrarily.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency signal transmission line comprising:
    an element;
    a linear signal line provided at the element and including a first end and a second end; and
    at least one ground conductor provided at the element and extending along the signal line; wherein
    the element includes stacked insulating layers;
    the ground conductor is positioned opposite to the signal line with the insulating layer positioned therebetween;
    the ground conductor includes a plurality of openings arranged along the signal line;
    the signal line, the ground conductor, and the element generate a characteristic impedance;
    the signal line includes a first section and a second section, the first section being an uninterrupted section generating a characteristic impedance greater than or equal to a first characteristic impedance at the first end and including the first end, the second section generating a characteristic impedance less than the first characteristic impedance and being adjacent to the first section;
    the second section is longer than the first section; and
    the openings are arranged in descending order of overlapping area with the signal line in the second section toward a farthest end from the first section.

2. The high-frequency signal transmission line according to claim 1, wherein the second section includes a characteristic impedance changing section adjacent to the first section and having a characteristic impedance decreasing toward the farthest end from the first section.

3. An electronic device comprising:
    a high-frequency signal transmission line; and
    a housing accommodating the high-frequency signal transmission line; wherein
    the high-frequency signal transmission line includes:
        an element;
        a linear signal line provided at the element and including a first end and a second end; and
        at least one ground conductor provided at the element and extending along the signal line;
    the element includes stacked insulating layers;
    the ground conductor is positioned opposite to the signal line with the insulating layer positioned therebetween;
    the ground conductor includes a plurality of openings arranged along the signal line;
    the signal line, the ground conductor, and the element generate a characteristic impedance;
    the signal line includes a first section and a second section, the first section being an uninterrupted section generating a characteristic impedance greater than or equal to a first characteristic impedance at the first end and including the first end, the second section generating a characteristic impedance less than the first characteristic impedance and being adjacent to the first section;
    the second section is longer than the first section; and
    the openings are arranged in descending order of overlapping area with the signal line in the second section toward a farthest end from the first section.

4. The electronic device according to claim 3, wherein the second section includes a characteristic impedance changing section adjacent to the first section and having a characteristic impedance decreasing toward a farthest end from the first section.

* * * * *